(12) United States Patent
Fukuoka et al.

(10) Patent No.: US 11,743,614 B2
(45) Date of Patent: Aug. 29, 2023

(54) SOLID-STATE IMAGING DEVICE AND ELECTRONIC APPARATUS WITH A CHARGE STORAGE UNIT ELECTRICALLY CONNECTED TO EACH OF A LOWER ELECTRODE OF A PHASE DIFFERENCE DETECTION PIXEL, AN ADJACENT PIXEL AND A NORMAL PIXEL VIA A CAPACITANCE, WHEREIN THE CAPACITANCE CONNECTED TO THE ADJACENT PIXEL IS GREATER THAN A CAPACITANCE CONNECTED TO THE NORMAL PIXEL

(71) Applicant: SONY SEMICONDUCTOR SOLUTIONS CORPORATION, Kanagawa (JP)

(72) Inventors: Shinpei Fukuoka, Nagasaki (JP); Hideaki Togashi, Nagasaki (JP); Yoshihiro Ando, Nagasaki (JP); Masashi Nakata, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/930,589

(22) Filed: Sep. 8, 2022

(65) Prior Publication Data

US 2023/0007198 A1 Jan. 5, 2023

Related U.S. Application Data

(63) Continuation of application No. 16/638,879, filed as application No. PCT/JP2018/019650 on May 22, 2018, now Pat. No. 11,509,846.

(30) Foreign Application Priority Data

Aug. 22, 2017 (JP) ................. 2017-159231

(51) Int. Cl.
*H04N 5/225* (2006.01)
*H04N 25/704* (2023.01)
(Continued)

(52) U.S. Cl.
CPC .......... *H04N 25/704* (2023.01); *H04N 25/77* (2023.01); *H10K 19/20* (2023.02); *H10K 39/32* (2023.02); *H01L 27/14647* (2013.01)

(58) Field of Classification Search
CPC ................................ H04N 25/704
See application file for complete search history.

(56) References Cited

U.S. PATENT DOCUMENTS

2013/0093932 A1 4/2013 Choo et al.
2015/0195466 A1 7/2015 Takase et al.
(Continued)

FOREIGN PATENT DOCUMENTS

CN 1834728 A 9/2006
CN 1996088 A 7/2007
(Continued)

OTHER PUBLICATIONS

International Search Report and Written Opinion of PCT Application No. PCT/JP2018/019650, dated Aug. 7, 2018, 10 pages of English Translation and 08 pages of ISRWO.
(Continued)

*Primary Examiner* — Gary C Vieaux
(74) *Attorney, Agent, or Firm* — CHIP LAW GROUP

(57) ABSTRACT

There is provided a solid-state imaging device that includes a substrate having a pixel array unit sectioned into a matrix, a plurality of normal pixels, a plurality of phase difference detection pixels, and a plurality of adjacent pixels adjacent to the phase difference detection pixels, each provided in each of the plurality of sections, in which each of the normal pixel, the phase difference detection pixel, and the adjacent
(Continued)

pixel has a photoelectric conversion film, and an upper electrode and a lower electrode that sandwich the photoelectric conversion film in a thickness direction of the photoelectric conversion film, and the lower electrode, in the adjacent pixel, extends from the section in which the adjacent pixel is provided to cover the section in which the phase difference detection pixel adjacent to the adjacent pixel is provided, when viewed from above the substrate.

16 Claims, 17 Drawing Sheets

(51) Int. Cl.
*H04N 25/77* (2023.01)
*H10K 19/20* (2023.01)
*H10K 39/32* (2023.01)
*H01L 27/146* (2006.01)

(56) References Cited

U.S. PATENT DOCUMENTS

| | | |
|---|---|---|
| 2016/0240571 A1 | 8/2016 | Baek |
| 2016/0301882 A1 | 10/2016 | Yamashita et al. |
| 2017/0243912 A1 | 8/2017 | Kaneda |
| 2018/0027171 A1 | 1/2018 | Yoshimura et al. |
| 2018/0374903 A1 | 12/2018 | Otake et al. |

FOREIGN PATENT DOCUMENTS

| | | |
|---|---|---|
| CN | 102725683 A | 10/2012 |
| CN | 103037161 A | 4/2013 |
| CN | 103050505 A | 4/2013 |
| CN | 105590939 A | 5/2016 |
| CN | 105898118 A | 8/2016 |
| CN | 107078147 A | 8/2017 |
| CN | 107112339 A | 8/2017 |
| DE | 102016102111 A1 | 8/2016 |
| JP | 2015-050331 A | 3/2015 |
| JP | 2016-127264 A | 7/2016 |
| JP | 2016-152417 A | 8/2016 |
| JP | 2016-201449 A | 12/2016 |
| JP | 2017-092150 A | 5/2017 |
| KR | 10-2013-0040439 A | 4/2013 |
| KR | 10-2016-0100569 A | 8/2016 |
| KR | 10-2017-0077116 A | 7/2017 |
| KR | 10-2017-0110581 A | 10/2017 |
| TW | 201618289 A | 5/2016 |
| TW | 201630175 A | 8/2016 |
| WO | 2014/208047 A1 | 12/2014 |
| WO | 2016/072281 A1 | 5/2016 |
| WO | 2016/104177 A1 | 6/2016 |
| WO | 2016/129406 A1 | 8/2016 |

OTHER PUBLICATIONS

Notice of Allowance for U.S. Appl. No. 16/638,879, dated Jul. 20, 2022, 10 pages.
Non-Final Office Action for U.S. Appl. No. 16/638,879, dated Apr. 6, 2022, 12 pages.
International Preliminary Report on Patentability of PCT Application No. PCT/JP2018/019650, dated Mar. 5, 2020, 10 pages of English Translation and 05 pages of IPRP.

SOLID-STATE IMAGING DEVICE AND ELECTRONIC APPARATUS WITH A CHARGE STORAGE UNIT ELECTRICALLY CONNECTED TO EACH OF A LOWER ELECTRODE OF A PHASE DIFFERENCE DETECTION PIXEL, AN ADJACENT PIXEL AND A NORMAL PIXEL VIA A CAPACITANCE, WHEREIN THE CAPACITANCE CONNECTED TO THE ADJACENT PIXEL IS GREATER THAN A CAPACITANCE CONNECTED TO THE NORMAL PIXEL

This application is Continuation application of U.S. patent application Ser. No. 16/638,879 filed on Feb. 13, 2020, which is a U.S. National Phase of International Patent Application No. PCT/JP2018/019650 filed on May 22, 2018, which claims priority benefit of Japanese Patent Application No. JP 2017-159231 filed in the Japan Patent Office on Aug. 22, 2017. Each of the above-referenced applications is hereby incorporated herein by reference in its entirety.

FIELD

The present disclosure relates to a solid-state imaging device and an electronic apparatus.

BACKGROUND

In recent years, an imaging apparatus has adopted a method of detecting a phase difference using a pair of phase difference detection pixels having asymmetric sensitivity with respect to an incident angle of light, as an autofocus function. An example of this includes a solid-state imaging device disclosed in Patent Literature 1 below. Specifically, in Patent Literature 1 described below, a light shielding film is provided partially to implement a phase difference detection pixel having a sensitivity that is asymmetric with respect to the incident angle of light. Alternatively, in Patent Literature 1 below, the shape of a lower electrode is formed different from the shape of the lower electrode of a normal pixel that generates a signal for image generation, and thereby achieves a phase difference detection pixel having asymmetric sensitivity with respect to the incident angle.

CITATION LIST

Patent Literature

Patent Literature 1: JP 2015-50331 A

SUMMARY

Technical Problem

In the technology disclosed in Patent Literature 1, a light shielding film is provided so as to cover a part of the phase difference detection pixel to block light, and thus, the light incident on the pixel is not considered to be sufficiently utilized. Therefore, the solid-state imaging device according to Patent Literature 1 has a limitation in improving the light detection sensitivity. Furthermore, in Patent Literature 1, a charge unnecessary for phase difference detection might be generated in detecting the phase difference, depending on the shape of the lower electrode. In such a case, it is necessary to provide a mechanism (such as a plug) for discharging an unnecessary charge in order to avoid generation of noise due to the unnecessary charge. However, in a case where a discharge mechanism is provided, it would be necessary to ensure a certain area in order to provide the mechanism, leading to limitation in miniaturization of the solid-state imaging device.

In view of the above situation, the present disclosure proposes a novel and improved solid-state imaging device and electronic apparatus that can improve detection sensitivity while enabling miniaturization of pixels.

Solution to Problem

According to the present disclosure, a solid-state imaging device is provided that includes: a substrate having a pixel array unit sectioned into a matrix; a plurality of normal pixels, a plurality of phase difference detection pixels, and a plurality of adjacent pixels adjacent to the phase difference detection pixels, each provided in each of the plurality of sections; wherein each of the normal pixel, the phase difference detection pixel, and the adjacent pixel has a photoelectric conversion film, and an upper electrode and a lower electrode that sandwich the photoelectric conversion film in a thickness direction of the photoelectric conversion film, the lower electrode, in the normal pixel, is provided separately for each of sections in which the normal pixel is provided, and the lower electrode, in the adjacent pixel, extends from the section in which the adjacent pixel is provided to the section in which the phase difference detection pixel adjacent to the adjacent pixel is provided, when viewed from above the substrate.

Moreover, according to the present disclosure, an electronic apparatus including a solid-state imaging device is provided, the solid-state imaging device comprising: a substrate having a pixel array unit sectioned into a matrix; a plurality of normal pixels, a plurality of phase difference detection pixels, and a plurality of adjacent pixels adjacent to the phase difference detection pixels, each provided in each of the plurality of sections; wherein each of the normal pixel, the phase difference detection pixel, and the adjacent pixel has a photoelectric conversion film, and an upper electrode and a lower electrode that sandwich the photoelectric conversion film in a thickness direction of the photoelectric conversion film, the lower electrode, in the normal pixel, is provided separately for each of sections in which the normal pixel is provided, and the lower electrode, in the adjacent pixel, extends from the section in which the adjacent pixel is provided to the section in which the phase difference detection pixel adjacent to the adjacent pixel is provided, when viewed from above the substrate.

Advantageous Effects of Invention

As described above, according to the present disclosure, it is possible to improve detection sensitivity while enabling miniaturization of pixels.

Note that the above-described effect is not necessarily limited, and it is also possible to use any of the effects illustrated in this specification together with the above-described effect or in place of the above-described effect, or other effects that can be assumed from this specification.

DESCRIPTION OF EMBODIMENTS

Figure 1:
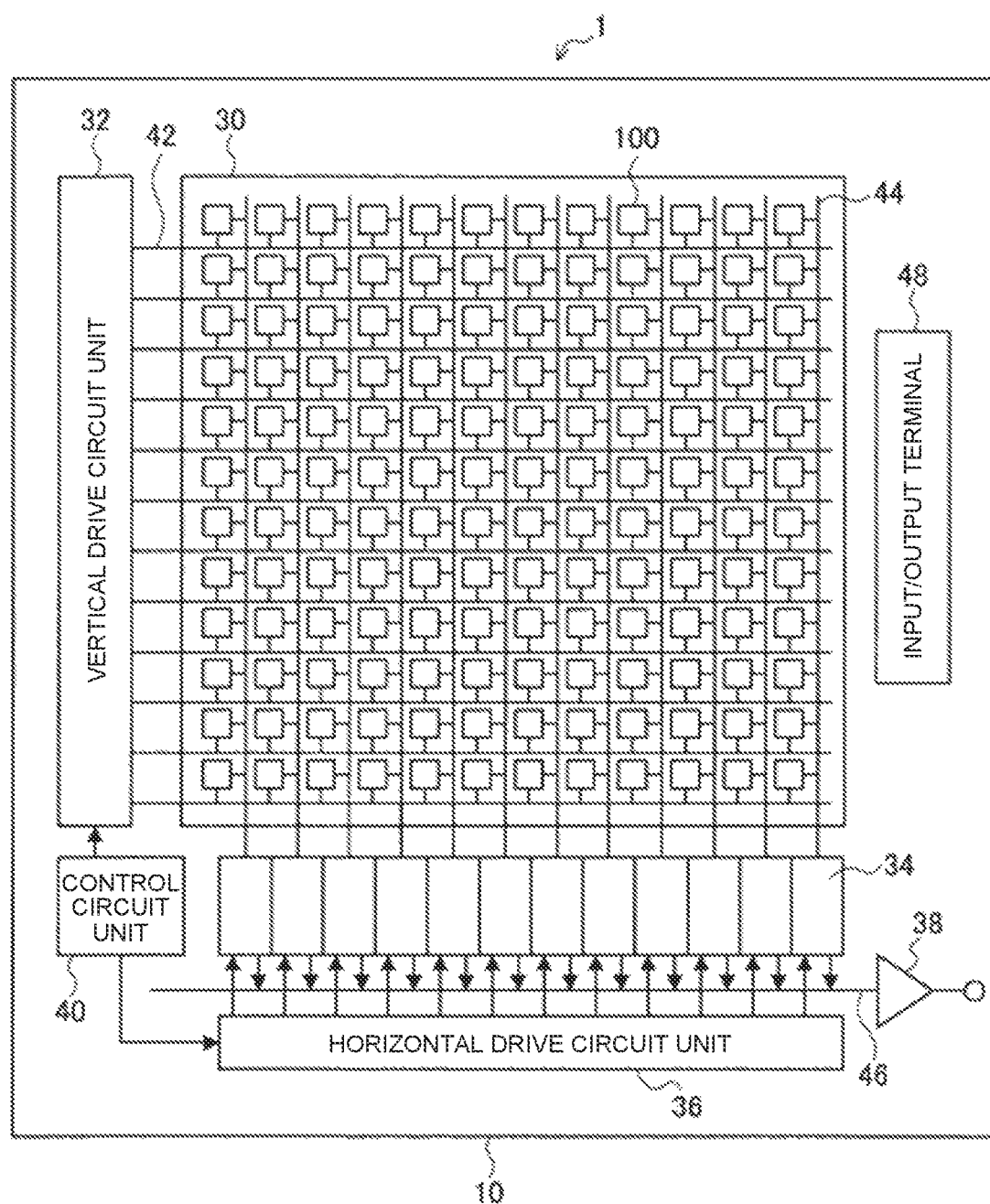
FIG. 1 is a diagram illustrating a planar configuration example of a solid-state imaging device according to an embodiment of the present disclosure.

Hereinafter, preferred embodiments of the present disclosure will be described in detail with reference to the accompanying drawings. Note that same reference numerals are given to components having substantially a same functional configuration, and redundant description will be omitted in the present specification and the drawings.

Furthermore, in this specification and the drawings, a plurality of constituents having substantially a same or similar function may be distinguished by giving the same reference numerals followed by different numbers in some cases. However, in a case where there is no need to particularly distinguish each of a plurality of constituents having substantially the same or similar functional configuration, the same reference numerals alone will be attached. Furthermore, similar constituents of different embodiments will be distinguished by attaching different alphabets after the same reference numerals in some cases. However, in a case where there is no need to particularly distinguish each of similar constituents, the same reference numerals alone will be attached.

The drawings referred to in the following description are drawings for facilitating the description and understanding of an embodiment of the present disclosure. Therefore, shapes, dimensions and ratios illustrated in the drawings might be different from the actual case. Furthermore, the design of the solid-state imaging device illustrated in the drawing can be appropriately changed in design in consideration of the following description and known techniques. In the description using a cross-sectional view of the solid-state imaging device, the up-down direction of the stacked structure of the solid-state imaging device corresponds to the relative direction when the light incident surface of the solid-state imaging device is defined as an upper direction. Therefore, the direction in description might be different from an up-down direction according to the actual gravitational acceleration.

The shapes expressed in the following description not only represent geometrically defined shapes, but also include shapes including tolerable differences (error/distortion) in the operation of the solid-state imaging device and the manufacturing process of the solid-state imaging device, as the shape similar to the defined shape.

Furthermore, in the following description, "electrical connection" means connection of a plurality of elements directly or indirectly via other elements.

The description will be given in the following order.
1. Schematic configuration of solid-state imaging device
2. Detailed configuration of normal pixels
3. Background of embodiments of the present disclosure on the side of the inventors
4. First Embodiment
4.1 Detailed configuration of solid-state imaging device
4.2 Detection method of phase difference
4.3 Modification
5. Second Embodiment
6. Third Embodiment
6.1 Detailed configuration of solid-state imaging device
6.2 Modification
7. Fourth Embodiment
8. Fifth Embodiment
9. Summary
10. Supplement

1. SCHEMATIC CONFIGURATION OF SOLID-STATE IMAGING DEVICE

First, a schematic configuration of a solid-state imaging device 1 according to an embodiment of the present disclosure will be described with reference to FIG. 1. FIG. 1 is a diagram illustrating a planar configuration example of the solid-state imaging device 1 according to an embodiment of the present disclosure. As illustrated in FIG. 1, the solid-state imaging device 1 according to an embodiment of the present disclosure includes, on a semiconductor substrate 10 formed of silicon, for example, a pixel array unit 30 having a plurality of pixels 100 arranged in a matrix, and a peripheral circuit unit provided so as to surround the pixel array unit 30. Furthermore, the solid-state imaging device 1 includes, as the peripheral circuit unit, a vertical drive circuit unit 32, a column signal processing circuit unit 34, a horizontal drive circuit unit 36, an output circuit unit 38, a control circuit unit 40, or the like Details of each of blocks of the solid-state imaging device 1 will be described below.

(Pixel Array Unit 30)

The pixel array unit 30 includes a plurality of pixels 100 two-dimensionally arranged in a matrix as described above. The plurality of pixels 100 further include a normal pixel 100x for generating a signal for image generation and a pair of phase difference detection pixels 100a and 100b for generating a signal for focus detection. In other words, some of the plurality of normal pixels 100x in the pixel array unit 30 have been replaced with the phase difference detection pixels 100a and 100b. Furthermore, as will be described below, the pixel array unit 30 in the embodiment of the present disclosure includes an adjacent pixel 100c adjacent to the phase difference detection pixels 100a and 100b. Here, a pixel represents one unit that detects light and is output as one unit as a result in the output of the detection result, and specifically represents the normal pixel 100x, the phase difference detection pixel 100a or 100b, or the like.

Specifically, the pair of phase difference detection pixel 100a and the phase difference detection pixel 100b is formed to have asymmetric sensitivity with respect to the incident angle of light. In this manner, the pair of phase difference detection pixels 100a and 100b has asymmetry with mutually different sensitivities with respect to the incident angle of light, leading to an occurrence of a shift in a detected image. The imaging apparatus (not illustrated) using the solid-state imaging device 1 calculates a defocus amount on the basis of this shift of images (phase difference), and adjusts (moves) the imaging lens (not illustrated), making it possible to implement autofocusing. The pair of phase difference detection pixels 100a and 100b may be arranged in a left-right direction (horizontal direction) in FIG. 1, or arranged in an up-down direction (vertical direction) in FIG. 1.

Each of the pixels 100 includes a photoelectric conversion element and a plurality of pixel transistors (for example, Metal-Oxide-Semiconductor (MOS) transistors) (not illustrated). Specifically, pixel transistor includes four types of MOS transistors, namely, a transfer transistor, a selection transistor, a reset transistor, and an amplification transistor, for example.

Each of the pixels 100 may have a shared pixel structure. In such a case, the pixel sharing structure includes a plurality of photoelectric conversion elements, a plurality of transfer transistors, one shared floating diffusion node (charge storage unit 24), and one shared transistor (not illustrated). That is, in the shared pixel structure, the photoelectric conversion elements and the transfer transistors constituting the plurality of unit pixels share one floating diffusion node and the shared transistor. The detailed structure of the normal pixel 100x will be described below.

(Vertical Drive Circuit Unit 32)

The vertical drive circuit unit 32 includes a shift register, for example, selects a pixel drive wire 42, supplies a pulse for driving the pixel 100 to the selected pixel drive wire 42, and drives the pixels 100 in units of rows. That is, the vertical drive circuit unit 32 selectively scans each of the pixels 100 of the pixel array unit 30 in the vertical direction (up-down direction in FIG. 1) sequentially in units of rows, and supplies a pixel signal based on the signal charge generated in accordance with the amount of light received by the photoelectric conversion element of each of the pixels 100 to the column signal processing circuit unit 34, which will be described below, through a vertical signal line 44.

(Column Signal Processing Circuit Unit 34)

The column signal processing circuit unit 34 is arranged for each of the columns of the pixels 100, and performs signal processing such as noise removal for each of pixel columns on the pixel signals output from the pixels 100 for one row. For example, the column signal processing circuit unit 34 performs signal processing such as Correlated Double Sampling (CDS) and Analog-Degital (A/D) conversion in order to remove pixel-specific fixed pattern noise.

(Horizontal Drive Circuit Unit 36)

The horizontal drive circuit unit 36 includes a shift register, for example, sequentially outputs horizontal scanning pulses to sequentially select each of the column signal processing circuit units 34 described above, and performs control to output the pixel signal from each of the column signal processing circuit units 34 to a horizontal signal line 46.

(Output Circuit Unit 38)

The output circuit unit 38 performs signal processing on the pixel signals sequentially supplied from each of the column signal processing circuit units 34 described above through the horizontal signal line 46, and outputs the processed signals. The output circuit unit 38 may function as a functional unit that performs buffering, for example, or may perform processing such as black level adjustment, column variation correction, and various digital signal processing. Note that buffering means temporarily storing pixel signals in order to compensate for differences in processing speed and transfer speed in exchanging pixel signals. In addition, an input/output terminal 48 is a terminal for exchanging signals with an external device.

(Control Circuit Unit 40)

The control circuit unit 40 receives an input clock and data for giving an instruction on an operation mode or the like, and outputs data such as internal information of the solid-state imaging device 1. That is, the control circuit unit 40 generates a clock signal and a control signal to be a reference of operation of the vertical drive circuit unit 32, the column signal processing circuit unit 34, the horizontal drive circuit unit 36, or the like, on the basis of a vertical synchronization signal, a horizontal synchronization signal, and a master clock. Then, the control circuit unit 40 outputs the generated clock signal and control signal to the vertical drive circuit unit 32, the column signal processing circuit unit 34, the horizontal drive circuit unit 36, or the like.

2. DETAILED CONFIGURATION OF NORMAL PIXELS

Figure 2:
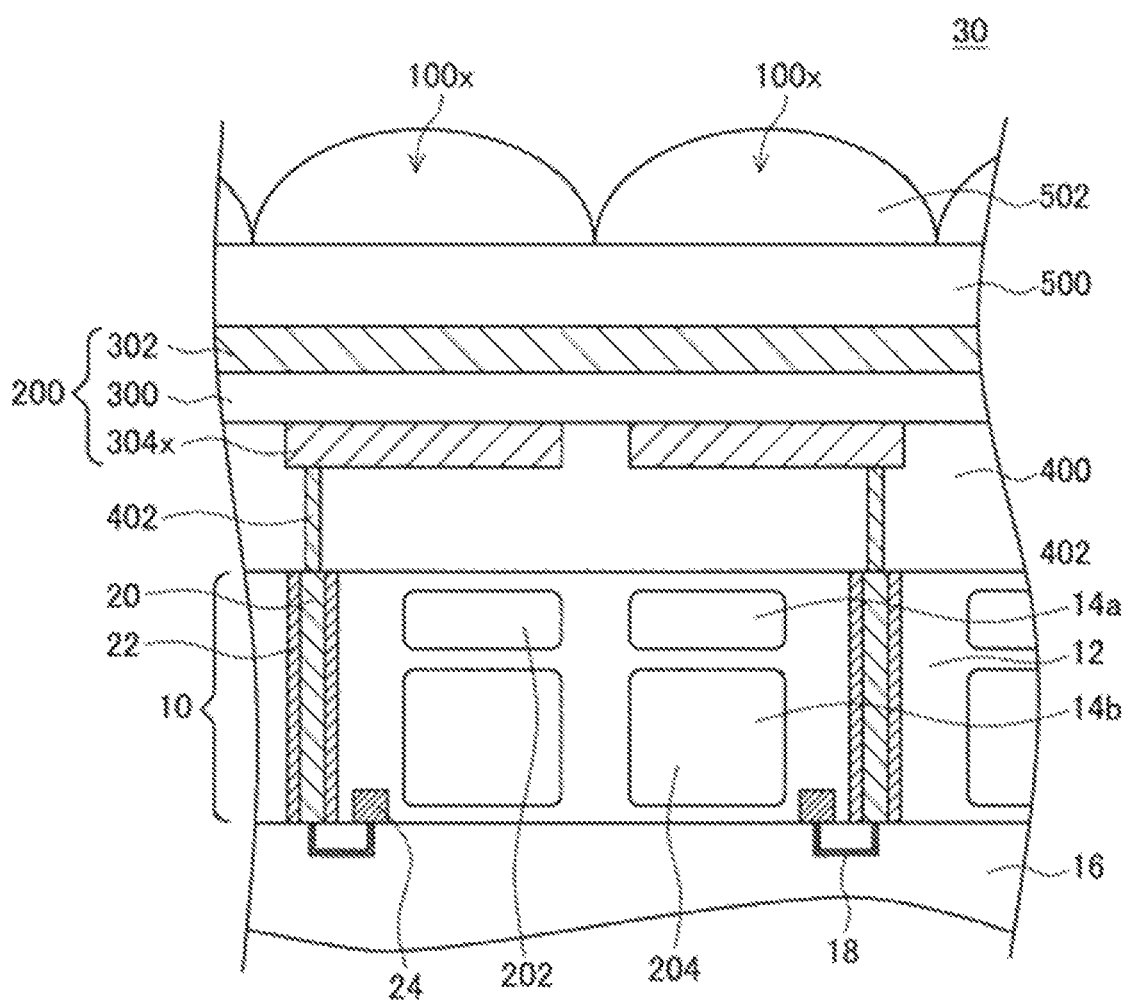
FIG. 2 is a view illustrating a cross-sectional configuration example of a normal pixel according to an embodiment of the present disclosure.

Next, a detailed configuration, in the cross-sectional structure, of the normal pixel 100 according to an embodiment of the present disclosure will be described with reference to FIG. 2. FIG. 2 is a view illustrating a cross-sectional configuration example of the normal pixel 100x according to an embodiment of the present disclosure. Specifically, the view corresponds to a portion of the cross section obtained by cutting the two normal pixels 100x of the pixel array unit 30 in the thickness direction of the semiconductor substrate 10.

As illustrated in FIG. 2, in the normal pixel 100x, two semiconductor regions 14a and 14b having a second conductivity type (for example, N-type) are formed on a semiconductor region 12 having a first conductivity type (for example, P-type) of the semiconductor substrate 10 formed of silicon, for example, so as to overlap with each other in the thickness direction of the semiconductor substrate 10. The semiconductor regions 14a and 14b formed in this manner make a PN junction to become two stacked photoelectric conversion elements (PD) 202 and 204, respectively. For example, the PD 202 having the semiconductor region 14a as a charge storage region is a photoelectric conversion element that absorbs blue light (for example, a wavelength of 450 nm to 495 nm) and generates charges (photoelectric conversion). The PD 204 having the semiconductor region 14*b* as a charge storage region is a photoelectric conversion element that absorbs red light (for example, a wavelength of 620 nm to 750 nm) and generates charges.

In addition, a wiring layer 16 is provided in a region of the semiconductor substrate 10 located on the opposite side of the semiconductor region 12 (lower side in FIG. 2). The wiring layer 16 includes a plurality of pixel transistors (not illustrated) that read out the charges stored in the PDs 202 and 204, and a plurality of wires 18 formed of tungsten (W), aluminum (Al), copper (Cu), or the like.

Furthermore, a plug 20 is provided on the semiconductor substrate 10 so as to penetrate the semiconductor substrate 10. The plug 20 is used to extract the charge photoelectrically converted by a photoelectric conversion film 300 described below, to the wiring layer 16. In order to suppress a short circuit with the semiconductor region 12, an insulating film 22 such as $SiO_2$ or SiN is formed on the outer periphery of the plug 20. The plug 20 may be connected to the floating diffusion node (charge storage unit) 24 provided in the semiconductor region having the second conductivity type (for example, N type) provided in the semiconductor substrate 10, by the wire 18 provided in the wiring layer 16. Note that the floating diffusion node 24 is a region that temporarily holds charges photoelectrically converted by the photoelectric conversion film 300.

As illustrated in FIG. 2, there is provided a transparent insulating film 400 formed of a laminated film of two or three layers of a hafnium oxide ($HfO_2$) film and a silicon oxide film, for example, on the semiconductor substrate 10. Since the transparent insulating film 400 can transmit light, the PDs 202 and 204 provided below can receive light and perform photoelectric conversion.

On the transparent insulating film 400, the photoelectric conversion film 300 is provided so as to be sandwiched between an upper electrode 302 and a lower electrode 304*x*. The photoelectric conversion film 300, the upper electrode 302, and the lower electrode 304*x* constitute a PD 200. For example, the PD 200 is a photoelectric conversion element that absorbs green light (for example, a wavelength of 495 nm to 570 nm) and generates charges (photoelectric conversion). The upper electrode 302 and the lower electrode 304*x* can be formed of a transparent conductive film such as an indium tin oxide (ITO) film or an indium zinc oxide film, for example. Although details will be described below, the phase difference is detected in the PD 200 included in the phase difference detection pixels 100*a* and 100*b*. Details of the material of the photoelectric conversion film 300 will be described below.

Furthermore, as illustrated in FIG. 2, the upper electrode 302 is provided to be shared by a plurality of pixels 100 (specifically, the normal pixel 100*x* and the phase difference detection pixels 100*a* and 100*b*) so as to be connected to each other. In contrast, the lower electrode 304*x* is provided separately in units of normal pixels 100*x*. In addition, the lower electrode 304*x* is electrically connected to the plug 20 described above by a wire 402 formed of tungsten, aluminum, copper, or the like that penetrates the transparent insulating film 400.

As illustrated in FIG. 2, a high refractive index layer 500 formed of an inorganic film such as a silicon nitride film (SiN), a silicon oxynitride film (SiON), or silicon carbide (SiC) is provided on the upper electrode 302. Furthermore, an on-chip lens (lens unit) 502 is provided on the high refractive index layer 500. The on-chip lens 502 can be formed of, for example, a silicon nitride film (SiN) or a resin material such as a styrene resin, an acrylic resin, a styrene-acrylic copolymer resin, or a siloxane resin.

As described above, the normal pixel 100*x* included in the solid-state imaging device 1 according to an embodiment of the present disclosure has a stacked structure in which the PDs 200, 202, and 204 corresponding to three colors of light are stacked. That is, the solid-state imaging device 1 described above can be defined as a vertical spectral type solid-state imaging device that performs photoelectric conversion on the green light by the photoelectric conversion film 300 (PD 200) formed above the semiconductor substrate 10, and that performs photoelectric conversion on the blue and red light respectively by the PD 202 and PD 204 in the semiconductor substrate 10.

The above-described photoelectric conversion film 300 can be formed of either an organic material (organic photoelectric conversion film) or an inorganic material (indefinite period photoelectric conversion film). For example, in formation of the photoelectric conversion film 300 from an organic material, it is possible to select one from four modes: (a) P-type organic semiconductor material, (b) N-type organic semiconductor material, (c) a stacked structure using at least two out of P-type organic semiconductor material layer, N-type organic semiconductor material layer, or a mixed layer (bulk heterostructure) of a P-type organic semiconductor material and an N-type organic semiconductor material, and (d) a mixed layer of a P-type organic semiconductor material and an N-type organic semiconductor material.

Specifically, examples of the P-type organic semiconductor material include naphthalene derivative, anthracene derivative, phenanthrene derivative, pyrene derivative, perylene derivative, tetracene derivative, pentacene derivative, quinacridone derivative, thiophene derivative, thienothiophene derivative, benzothiophene derivative, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes with heterocyclic compounds as ligands, polythiophene derivatives, poly(benzothiadiazoles) derivatives, and polyfluorene derivatives.

In addition, examples of N-type organic semiconductor materials include fullerenes and fullerene derivatives (for example, fullerenes such as C60, C70, and C74 (higher fullerenes, endohedral fullerenes, etc.) or fullerene derivatives (for example, fullerene fluoride or Phenyl-$C_{61}$-Butyric Acid Methyl Ester (PCBM), Fullerene compounds, fullerene multimers, etc.)), organic semiconductor having Highest Occupied Molecular Orbital (HOMO) and Lowest Unoccupied Molecular Orbital (LUMO) deeper than P-type organic semiconductor, or transparent inorganic metal oxide. More specific examples of the N-type organic semiconductor material include a heterocyclic compound containing a nitrogen atom, an oxygen atom, or a sulfur atom, for example, an organic molecules including a pyridine derivative, a pyrazine derivative, a pyrimidine derivative, a triazine derivative, a quinoline derivative, a quinoxaline derivative, an isoquinoline derivative, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, polyfluorene derivatives, or the like, as a part of molecular skeleton, organometallic complexes, and subphthalocyanine derivatives. In addition, examples of a group contained in the fullerene derivative include a branched or cyclic alkyl group or a phenyl group; a group having a linear or condensed aromatic compound; a group having a halide; a partial fluoroalkyl group; a perfluoroalkyl group; silylalkyl group; silylalkoxy group; arylsilyl group; arylsulfanyl group; alkylsulfanyl group; arylsulfonyl group; alkylsulfonyl group; arylsulfide group; alkylsulfide group; amino group; alkylamino group; arylamino group; hydroxy group; alkoxy group; acylamino group; acyloxy group; carbonyl group; carboxy group; carboxamide group; carboalkoxy group; acyl group; sulfonyl group; cyano group; nitro group; a group having chalcogenide; phosphine group; phosphone group; or derivatives of these. Note that the thickness of the photoelectric conversion film 300 formed of an organic material is not limited, but may be, for example, $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m. In the above description, organic semiconductor materials are classified into P-type and N-type, in which P-type means that holes are easily transported, and N-type means that electrons are easily transported. That is, in the organic semiconductor material, the types are not be limited to the interpretation of having holes or electrons as majority carriers for thermal excitation, unlike the case of inorganic semiconductor materials.

More specifically, in order to function as the photoelectric conversion film 300 of the PD 200 that receives green light and performs photoelectric conversion, the photoelectric conversion film 300 may include a rhodamine dye, a melocyanine dye, a quinacridone derivative, a subphthalocyanine dye (subphthalocyanine derivatives), or the like.

Furthermore, when the photoelectric conversion film 300 is formed from an inorganic material, examples of the inorganic semiconductor material include crystalline silicon, amorphous silicon, microcrystalline silicon, crystalline selenium, amorphous selenium, and chalcopyrite compound such as CIGS(CuInGaSe), CIS(CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, AgInSe$_2$, or III-V group compounds such as GaAs, InP, AlGaAs, InGaP, AlGaInP, InGaAsP, and other compound semiconductors such as CdSe, CdS, In$_2$Se$_3$, In$_2$S$_3$, Bi$_2$Se$_3$, Bi$_2$S$_3$, ZnSe, ZnS, PbSe, or PbS. In addition, quantum dots formed of these materials can be used as the photoelectric conversion film 300.

In the embodiment of the present disclosure, the normal pixel 100x of the solid-state imaging device 1 is not limited to the structure in which the PD 200 having the photoelectric conversion film 300 provided above the semiconductor substrate 10 and the PD 202 and PD 204 provided in the semiconductor substrate 10 are stacked. For example, in the present embodiment, the normal pixel 100x of the solid-state imaging device 1 may have a structure in which a PD 200 having a photoelectric conversion film 300 provided above the semiconductor substrate 10 and a PD 202 provided in the semiconductor substrate 10 are stacked, that is, a structure including stacked two PDs, namely, PD 200 and PD 202. In the present embodiment, the normal pixel 100x of the solid-state imaging device 1 may have a structure having three PDs 200, 202, and 204 stacked above the semiconductor substrate 10. In such a case, each of the PDs 200, 202, and 204 may have a photoelectric conversion film 300, and the photoelectric conversion film 300 may be formed of an organic semiconductor material. At this time, in order to function as the photoelectric conversion film 300 of the PD 202 that receives blue light and performs photoelectric conversion, the photoelectric conversion film 300 may include a coumaric acid dyes, tris-8-hydroxyquinolinium (Alq$_3$), merocyanine-based dyes, for example. In addition, in order to function as the photoelectric conversion film 300 of the PD 204 that receives red light and performs photoelectric conversion, the photoelectric conversion film 300 may include phthalocyanine dyes, subphthalocyanine dyes (subphthalocyanine derivatives), or the like.

3. BACKGROUND OF EMBODIMENTS OF THE PRESENT DISCLOSURE ON THE SIDE OF THE INVENTORS

Next, before describing the details of individual embodiments according to the present disclosure, a background of embodiments of the present disclosure on the side of the inventors will be described.

As described above, an imaging apparatus has adopted a method of detecting a phase difference using a pair of phase difference detection pixels having asymmetric sensitivity with respect to an incident angle of light, as an autofocus function. For example, in Patent Literature 1 described below, a light shielding film is partially provided to implement a phase difference detection pixel having a sensitivity that is asymmetric with respect to the incident angle of light. Alternatively, in Patent Literature 1 described above, the area of a lower electrode is set to half the area of the lower electrode of a normal pixel that generates a signal for image generation, and the lower electrode is disposed unevenly within the phase difference detection pixel formation region, and thereby achieves the phase difference detection pixel having asymmetric sensitivity with respect to the incident angle.

However, in the technology disclosed in Patent Literature 1, a light shielding film is provided so as to cover a part of the phase difference detection pixel to block light, and thus, the light incident on the pixel is not sufficiently utilized. Therefore, the solid-state imaging device according to Patent Literature 1 has a limitation in improving the light detection sensitivity. Furthermore, when the light shielding film is provided, there is a possibility that light travels in an unintended optical path due to reflection on the shielding film to cause the light to be incident on the surrounding pixels, resulting in color mixing.

In the technology disclosed in Patent Literature 1, a charge unnecessary for phase difference detection might be generated in detecting the phase difference, depending on the shape of the lower electrode of the phase difference detection pixel. In such a case, at the time of phase difference detection, the unnecessary charge might leak to the lower electrode, leading to a failure in achieving a sufficient separation ratio or occurrence of noise or afterimages. In other words, the technology has had a limit in improving the detection sensitivity of the phase difference. In order to improve the detection sensitivity of the phase difference, it is conceivable to provide a mechanism (such as a plug) for discharging the unnecessary charge in the phase detection pixel. However, in a case where a discharge mechanism is provided, it is necessary to ensure a certain area in order to provide the mechanism, and thus there has been a limitation in miniaturization of the solid-state imaging device.

Therefore, in view of such a situation, the present inventors have conceived embodiments according to the present disclosure that makes it possible to improve detection sensitivity while enabling miniaturization of pixels. Specifically, according to the embodiments of the present disclosure, the lower electrode of the adjacent pixel 100c adjacent to the phase difference detection pixels 100a and 100b is provided across the section where the phase difference detection pixels 100a and 100b are provided, making it possible to improve detection sensitivity while enabling miniaturization of pixels. Details of the embodiments according to the present disclosure will be sequentially described below.

4. FIRST EMBODIMENT

4.1 Detailed Configuration of Solid-State Imaging Device

Figure 3:
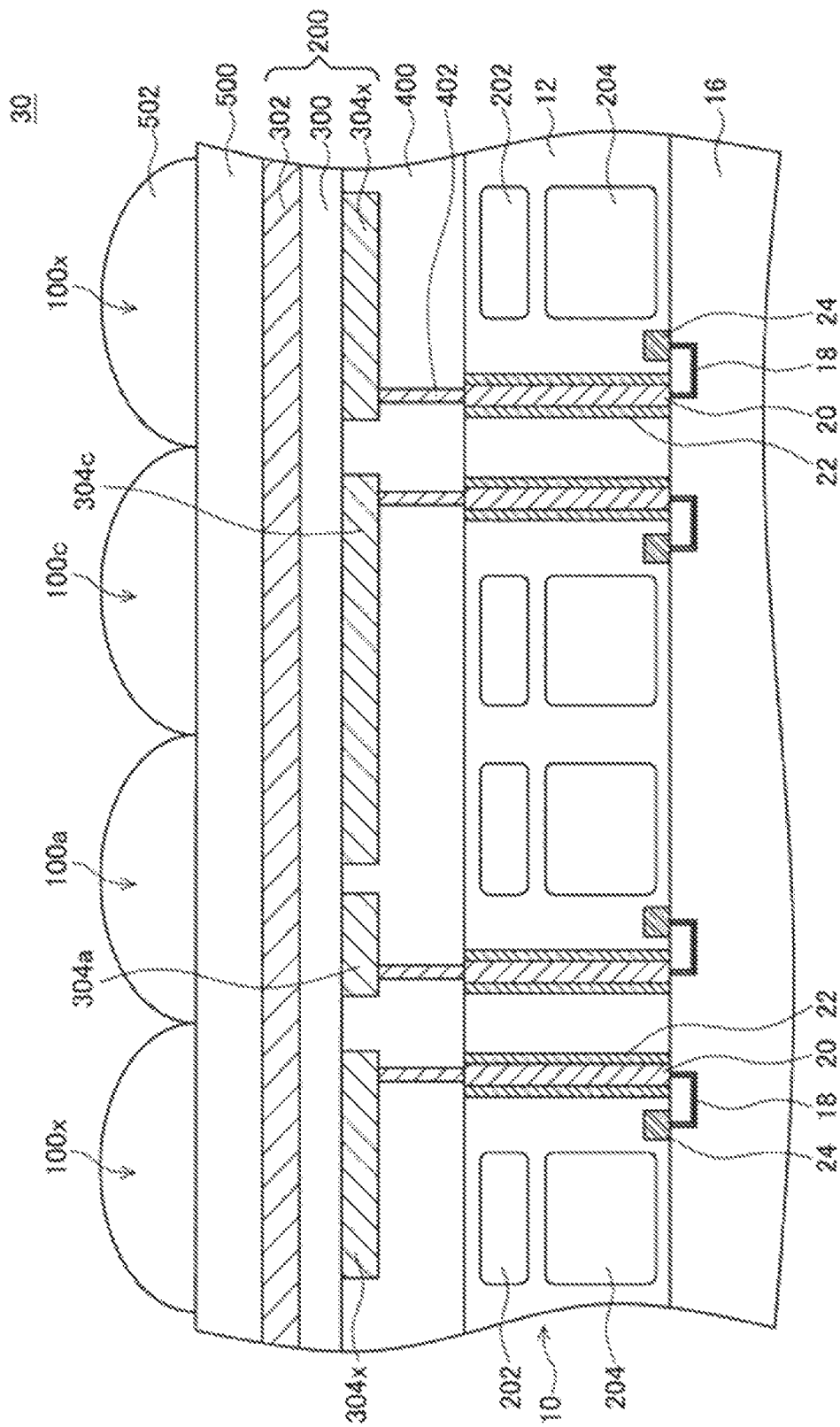
FIG. 3 is a view illustrating a cross-sectional configuration example of a phase difference detection pixel and adjacent pixels according to a first embodiment of the present disclosure.
Figure 4:
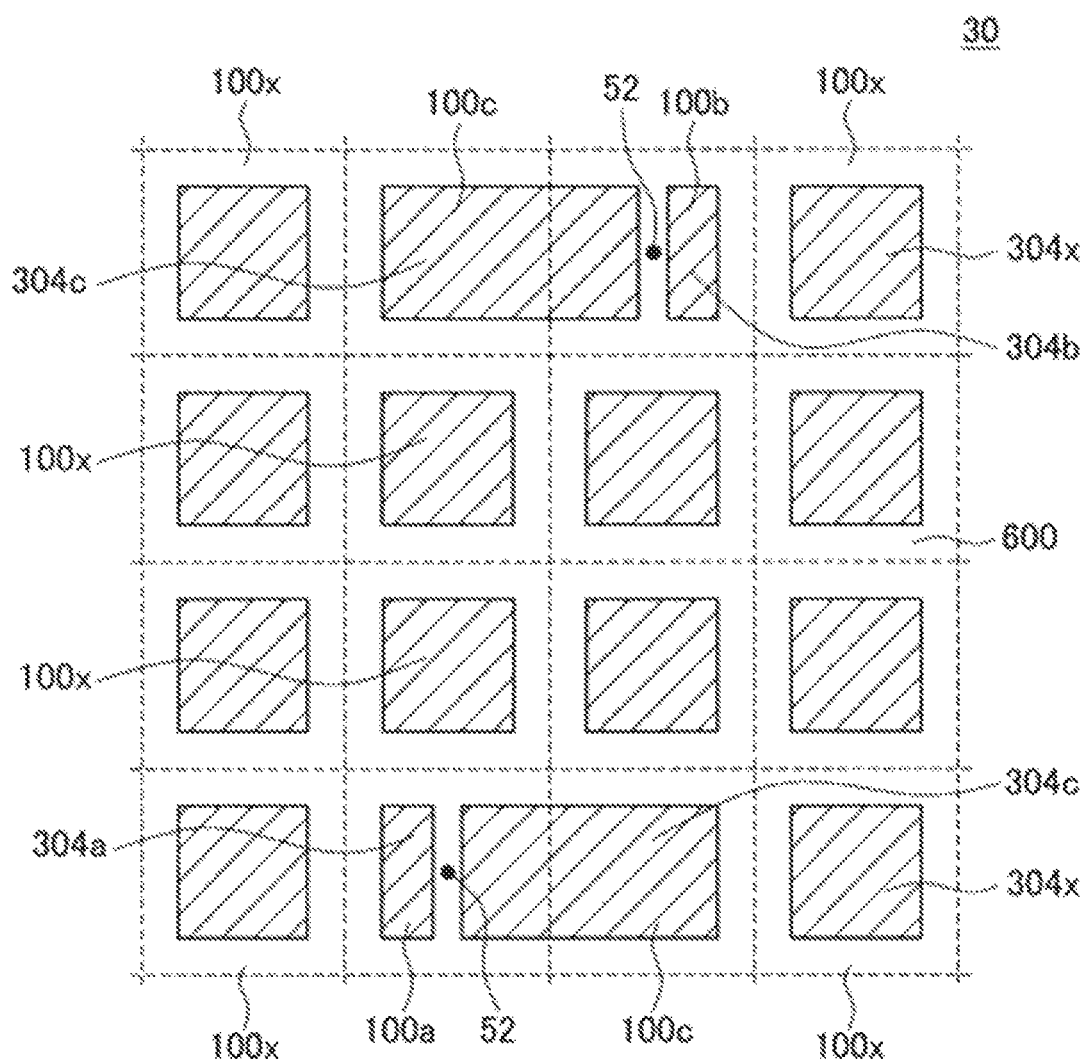
FIG. 4 is a view illustrating a planar configuration example of a pixel array unit according to the embodiment.

First, a detailed configuration of the phase difference detection pixel 100a and the adjacent pixel 100c according to a first embodiment of the present disclosure will be described with reference to FIGS. 3 and 4. FIG. 3 is a view illustrating a cross-sectional configuration example of the phase difference detection pixel 100a and the adjacent pixel 100c according to the present embodiment. In detail, FIG. 3 corresponds to a cross section obtained by cutting the pixels arranged in the pixel array unit 30, namely, the normal pixels 100x, the phase difference detection pixels 100a, the adjacent pixel 100c, and the normal pixels 100x arranged from the left in this order, in the thickness direction of the semiconductor substrate 10. FIG. 4 is a view illustrating a planar configuration example of the pixel array unit 30 according to the present embodiment, and specifically illustrates a partial plane of the pixel array unit 30. In FIG. 4, a rectangular region surrounded by a broken line indicates a basic range of a section 600 that forms one pixel. More specifically, each of the sections 600 corresponds to each of on-chip lenses 502 located above the semiconductor substrate 10. Accordingly, the stacked PD 202 and PD 204 are also provided for each of pixels. Furthermore, to facilitate understanding, FIG. 4 omits illustration of layers located above the lower electrode 304, such as the upper electrode 302 and the photoelectric conversion film 300. The planar configuration example illustrated in FIG. 4 may be a central region of the pixel array unit 30 or an outer edge portion of the pixel array unit 30.

In the following description, the adjacent pixel 100c is a pixel provided adjacent to each of the phase difference detection pixels 100a and 100b. Accordingly, one adjacent pixel 100c exists corresponding to each of the phase difference detection pixels 100a and 100b.

As illustrated in FIG. 3, the phase difference detection pixel 100a and the adjacent pixel 100c have a stacked structure substantially similar to the normal pixel 100x described above, except for the difference of the shape of the lower electrodes 304a and 304c from the shape of the normal pixel 100x. Specifically, as described above, the lower electrode 304x in the normal pixel 100x is provided in units of the normal pixel 100x. In contrast, the lower electrode 304c of the adjacent pixel 100c is provided across from the pixel formation region of the adjacent pixel 100c to the pixel formation region (section 600) of the adjacent phase difference detection pixel 100a. Furthermore, the lower electrode 304a of the phase difference detection pixel 100a is provided on the left side of the pixel formation region (section 600) of the phase difference detection pixel 100a. The lower electrodes 304a and 304c are electrically connected to the charge storage unit 24 provided on the semiconductor substrate 10 via the plug 20 or the like, similarly to the lower electrode 304x of the normal pixel 100x.

In FIG. 3, for the sake of convenience, the normal pixel 100x, the phase difference detection pixel 100a, the adjacent pixel 100c, and the normal pixel 100x are arranged in this order from the left side in the drawing. However, there is no limitation, in the present embodiment, to such an example, and the arrangement in the pixel array unit 30 can be selected in any manner.

Furthermore, as illustrated in FIG. 4, the pixel array unit 30 includes the phase difference detection pixel 100a and the adjacent pixel 100c arranged adjacent to each other in the horizontal direction (left-right direction in the drawing). Furthermore, in the phase difference detection pixel 100b paired with the phase difference detection pixel 100a, the lower electrode 304b is arranged within a light receiving surface (section 600) of the phase difference detection pixel 100b so as to be left-right symmetric to the lower electrode 304a of the phase difference detection pixel 100a. The adjacent pixel 100c corresponding to the phase difference detection pixel 100b is arranged so as to be adjacent to the phase difference detection pixel 100b in the horizontal direction. Furthermore, as illustrated in FIG. 4, the phase difference detection pixel 100a and the adjacent pixel 100c adjacent to the phase difference detection pixel 100a are arranged in line with the phase difference detection pixel 100b and the adjacent pixel 100c adjacent to the phase difference detection pixel 100b, in the vertical direction (up-down direction in the drawing) across the two normal pixels 100x. In FIG. 4, the phase difference detection pixels 100a and 100b, or the like, are provided across the two normal pixels 100x. However, there is no limitation, in the present embodiment, to two normal pixels 100x, and the pixels may be arranged across a single, or two or more normal pixels 100x.

In other words, in the present embodiment, the lower electrodes 304a and 304b are provided at positions shifted to the left or right in the light receiving surfaces of the phase difference detection pixels 100a and 100b, so as to form the phase difference detection pixels 100a and 100b to have asymmetric sensitivity with respect to the incident angle of green light 800. In FIG. 4, the pair of phase difference detection pixels 100a and 100b has the lower electrodes 304a and 304b respectively at positions that are left-right symmetric with respect to each other, leading to high sensitivity to phase difference detection in the horizontal direction. Details of the phase difference detection method by the phase difference detection pixels 100a and 100b will be described below.

Here, the light receiving surface represents a surface of each of pixels on which the PDs 200, 202, and 204 stacked in the normal pixel 100x and the phase difference detection pixels 100a and 100b receive light when viewed from above the semiconductor substrate 10. More specifically, the light receiving surface corresponds to the section (pixel formation region) 600 surrounded by a broken line in the plan view of FIG. 4.

As illustrated in FIG. 4, regarding the normal pixel 100x, as described above, the rectangular lower electrode 304x is provided separately for each of the sections 600 in which the normal pixel 100x is provided. That is, the lower electrode 304x is provided separately for each of pixels. Furthermore, for the phase difference detection pixels 100a and 100b, the rectangular lower electrodes 304a and 304b are provided so as to cover only the right side portion or the left side portion of the section 600 where the phase difference detection pixels 100a and 100b are provided. In other words, the lower electrodes of the phase difference detection pixels 100a and 100b can be regarded as one piece of two divided lower electrodes 304x of the normal pixel 100x. Furthermore, in the adjacent pixel 100c, the rectangular lower electrode 304c is provided to cover from the section 600 including the adjacent pixel 100c up to the section 600 including the phase difference detection pixels 100a and 100b adjacent to the adjacent pixel 100c when viewed from above the semiconductor substrate 10. In other words, the lower electrode 304c of the adjacent pixel 100c can be regarded as a combination of the lower electrode 304x of the normal pixel 100x and one piece of the two divided lower electrodes 304x.

As illustrated in FIG. 4, the lower electrodes 304a and 304b of the phase difference detection pixels 100a and 100b and the lower electrode 304c of the adjacent pixel 100c adjacent to the phase difference detection pixels 100a and 100b are preferably located, viewed from above the semiconductor substrate 10, at positions symmetric with each other with respect to an optical axis 52 of the on-chip lens 502 of the section in which the phase difference detection pixels 100a and 100b are provided. With a configuration in which the lower electrodes 304a, 304b, and 304c are symmetric with each other with respect to the optical axis 52 in this manner, the lower electrodes 304a and 304b each have a shape corresponding to the incident direction of light. This makes it possible to collect light further efficiently and improve the detection sensitivity in detecting the phase difference.

In addition, it is preferable, in the pixel array unit 30, to provide a large number of normal pixels 100x in order to increase the resolution of the captured image. However, when the number of phase difference detection pixels 100a and 100b is small, the accuracy and speed of focus would be degraded. Therefore, it is preferable to appropriately select the number of phase difference detection pixels 100a and 100b provided in the pixel array unit 30, their formation positions, or the like, in consideration of the balance between the resolution and the focus accuracy.

4.2 Detection Method of Phase Difference

Figure 5:
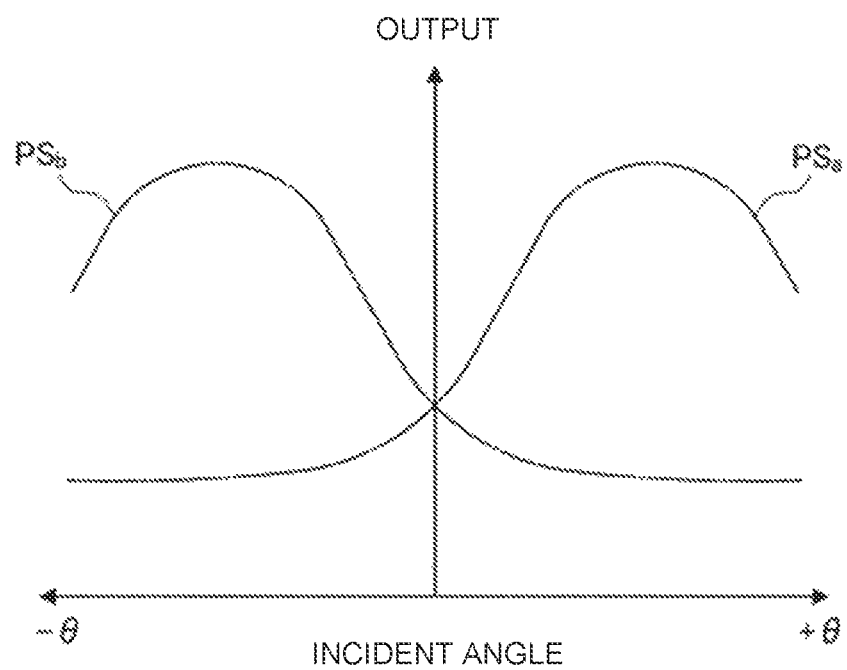
FIG. 5 is a graph illustrating an output with respect to an incident angle of a pair of phase difference detection pixels according to the embodiment.

Next, a method for detecting a phase difference in the solid-state imaging device 1 according to the first embodiment will be described with reference to FIG. 5. FIG. 5 is a graph illustrating signal output (sensitivity), with respect to the incident angle of light, of the PD 200 of the pair of phase difference detection pixels 100a and 100b according to the present embodiment. Note that the incident angle with a negative sign in FIG. 5 represents that incident light is incident diagonally from the left side in the drawing with respect to the optical axis 52 of the on-chip lens 502 provided in the phase difference detection pixels 100a and 100b illustrated in FIG. 4. In contrast, the incident angle with a positive sign represents that incident light is incident diagonally from the right side in the drawing with respect to the optical axis 52 of the on-chip lens 502 provided in the above-described phase difference detection pixels 100a and 100b.

In one of the pixels, that is, the phase difference detection pixel 100a, it is possible to acquire an output signal that has been photoelectrically converted by the photoelectric conversion film 300 on the left side in the section 600, that is, photoelectrically converted on the left side of the PD 200. As a result, the PD 200 of the phase difference detection pixel 100a exhibits an output tendency with respect to the incident angle as indicated by PSa in FIG. 5. Specifically, in a case where the PD 200 of the phase difference detection pixel 100a receives light incident from the left side (light whose incident angle is indicated by a negative sign) with respect to the optical axis 52 of the on-chip lens 502 provided in the phase difference detection pixel 100a, the PD 200 outputs a low signal, or outputs no signal. In contrast, in a case where the PD 200 of the phase difference detection pixel 100a receives light incident from the right side with respect to the optical axis (light whose incident angle is indicated by positive sign), the PD 200 outputs a high signal. That is, the PD 200 of the phase difference detection pixel 100a has a signal output tendency (sensitivity) that is asymmetric with respect to a Y axis (optical axis 52) where the incident angle is 0 degrees.

The other pixel, namely, the phase difference detection pixel 100b can acquire a signal that has been photoelectrically converted by the right photoelectric conversion film 300 in the section 600, that is, a signal that has been photoelectrically converted by the right side of the PD 200. As a result, the PD 200 of the phase difference detection pixel 100b exhibits an output tendency with respect to the incident angle as indicated by PSb in FIG. 5. Specifically, in a case where the PD 200 of the phase difference detection pixel 100b receives light incident from the right side (light whose incident angle is indicated by positive sign) with respect to the optical axis 52 of the on-chip lens 502 provided in the phase difference detection pixel 100b, the PD 200 outputs a low signal, or outputs no signal. In contrast, in a case where the PD 200 of the phase difference detection pixel 100b receives light incident from the left side with respect to the optical axis (light whose incident angle is indicated by a negative sign), the PD 200 outputs a high signal. That is, the PD 200 of the phase difference detection pixel 100b, similarly to the phase difference detection pixel 100a, exhibits a signal output tendency (sensitivity) that is asymmetric with respect to the Y axis (optical axis 52) where the incident angle is 0 degrees.

As described above, the PD 200 of the phase difference detection pixels 100a and 100b has a signal output tendency (sensitivity) having asymmetry with respect to the incident angle of light. That is, the pair of phase difference detection pixels 100a and 100b has a tendency to output signals symmetric to each other with respect to the Y axis (optical axis 52) having an incident angle of 0 degrees as illustrated in FIG. 5. In this manner, the pair of phase difference detection pixels 100a and 100b has mutually different sensitivities with respect to the incident angle of light, leading to an occurrence of a shift (phase difference) in a detected image. Therefore, in the present embodiment, it is possible to detect such a difference (phase difference) between the output signals as a difference signal by a detection unit (not illustrated) of the output circuit unit 38, for example. In the present embodiment, the defocus amount is calculated on the basis of the detected phase difference, and an image forming lens (not illustrated) is adjusted (moved), thereby achieving autofocus.

While the above description is an example in which the phase difference is detected as a difference between the output signals of the phase difference detection pixels 100a and 100b, the present embodiment is not limited to this, for example, and the phase difference may be detected as a ratio of the output signals of the phase difference detection pixels 100a and 100b.

Meanwhile, in one phase difference detection pixel 100a, the charge photoelectrically converted by the photoelectric conversion film 300 on the right side of the section 600 of the phase difference detection pixel 100a is unnecessary when detecting the above-described phase difference. Furthermore, in the other phase difference detection pixel 100b, the charge photoelectrically converted by the photoelectric conversion film 300 on the left side of the section 600 of the phase difference detection pixel 100b is unnecessary when detecting the above-described phase difference. Accordingly, in the present embodiment, such unnecessary charges can be extracted as signals via the lower electrode 304c of the adjacent pixel 100c, provided across the sections of the phase difference detection pixels 100a and 100b. For example, the above-described unnecessary charges can be extracted to the charge storage unit 24 electrically connected to the lower electrode 304c via the plug 20. As a result, in the present embodiment, it is possible to avoid mixture of unnecessary charges to the lower electrodes 304a and 304b of the phase difference detection pixels 100a and 100b at the time of phase calculation. This means it is possible to avoid occurrence of failure in achieving a sufficient separation ratio, or occurrence of noise or afterimage, leading to improvement of phase difference detection accuracy.

Furthermore, in the present embodiment, unnecessary charges extracted via the lower electrode 304c of the adjacent pixel 100c, together with charges photoelectrically converted by the photoelectric conversion film 300 in the section 600 of the adjacent pixel 100c, may be utilized as signals for image generation. That is, while the PD 200 of the adjacent pixel 100c includes the lower electrode 304c provided across from the section 600 where the adjacent pixel 100c is provided up to the section 600 where the phase difference detection pixels 100a and 100b adjacent to the adjacent pixel 100c are provided unlike the normal pixel 100x, it is possible to function similarly to the normal pixel 100x. Therefore, according to the present embodiment, even if there is a charge unnecessary for phase difference detection generated by photoelectric conversion in the photoelectric conversion film 300 on the right side or the left side of the section 600 of the phase difference detection pixels 100a and 100b, it is possible to use the charge as an image generation signal. As a result, according to the present embodiment, the light incident on the section 600 of the phase difference detection pixels 100a and 100b can be fully utilized, leading to further improvement of the light detection sensitivity of the solid-state imaging device 1.

Moreover, according to the present embodiment, it is not necessary to newly provide a mechanism such as a plug for discharging an unnecessary charge as described above, making it possible to achieve miniaturization of the solid-state imaging device 1.

Furthermore, in the present embodiment, since no light shielding film is provided on the phase difference detection pixels 100a and 100b, it is possible to use the PD 202 and PD 204 positioned below similarly to the PD 202 and PD 204 of the normal pixel 100x. This makes it possible to further improve the light detection sensitivity of the solid-state imaging device 1. Furthermore, the configuration according to the present embodiment includes no light shielding film. Accordingly, there is no possibility that an unnecessary charge generated by the incident light due to the reflection of the light shielding film would leak to and have an adverse effect on the peripheral pixels 100.

4.3 Modifications

Next, first to fourth modifications of the present embodiment will be described with reference to FIGS. 6 to 9, respectively. FIGS. 6 to 9 are views illustrating planar configuration examples of the pixel array unit 30 according to the first to fourth modifications of the present embodiment, and specifically illustrate a partial plane of the pixel array unit 30. Furthermore, similarly to FIG. 4, to facilitate understanding, FIGS. 6 to 9 omit illustration of layers located above the lower electrode 304, such as the upper electrode 302 and the photoelectric conversion film 300. The planar configuration examples illustrated in FIGS. 6 to 9 may be a central portion of the pixel array unit 30 or an outer edge portion of the pixel array unit 30.

First Modification

In the first embodiment described above, the phase difference detection pixel 100a and the phase difference detection pixel 100b are provided adjacent to each other via the normal pixel 100x. However, the embodiment of the present disclosure is not limited to the configuration in which the phase difference detection pixel 100a and the phase difference detection pixel 100b are provided to be adjacent to each other via the normal pixel 100x as described above, and may be provided adjacent to each other on the pixel array unit 30.

Figure 6:
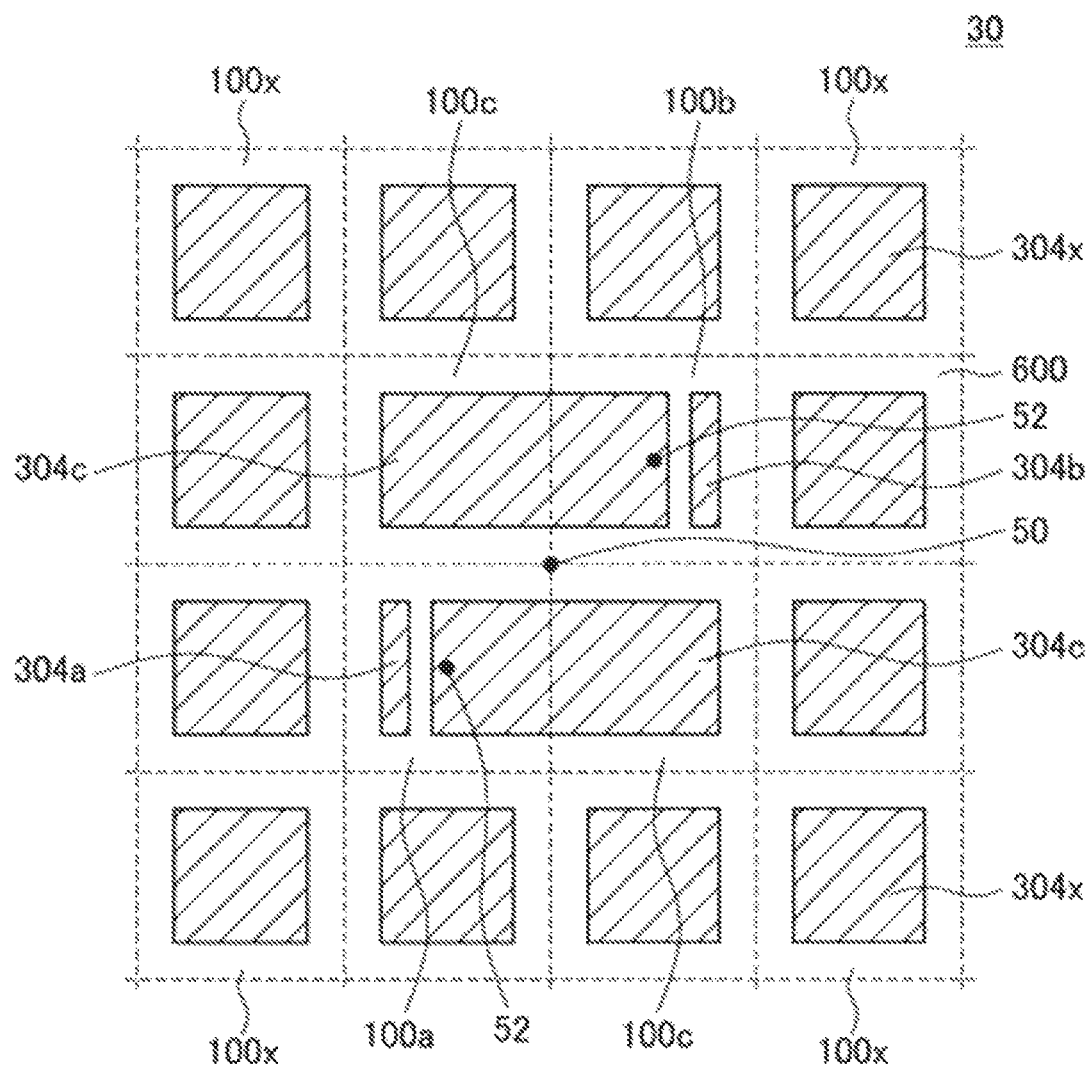
FIG. 6 is a view illustrating a planar configuration example of a pixel array unit according to a first modification of the embodiment.

Specifically, as illustrated in FIG. 6, the phase difference detection pixel 100a and the adjacent pixel 100c adjacent to the phase difference detection pixel 100a are arranged in line with the phase difference detection pixel 100b and the adjacent pixel 100c adjacent to the phase difference detection pixel 100b, in the vertical direction (up-down direction in the drawing). In other words, the phase difference detection pixel 100b is arranged at a position that is symmetric with respect to the phase difference detection pixel 100a about the center point 50 of the pixel array unit 30 in FIG. 6 as the center of symmetry. Furthermore, in the present modification, as illustrated in FIG. 6, the lower electrode 304c of the adjacent pixel 100c may be provided so as to extend from the section 600 including the adjacent pixel 100c beyond the optical axis 52 of the on-chip lens 502 in the section 600 including the phase difference detection pixels 100a and 100b adjacent to the adjacent pixel 100c when viewed from above the semiconductor substrate 10. In this manner, with the configuration in which the lower electrode 304c is provided so as to extend beyond the optical axis 52, it is possible, when the adjacent pixel 100c is used as the normal pixel 100 that generates a signal for image generation, to further improve the light detection sensitivity on the PD 200 of the adjacent pixel 100c, compared with the above-described first embodiment illustrated in FIG. 4. Note that the optical axis 52 described above is located at the center of the on-chip lens 502, that is, located at the center of the section 600.

Second Modification

Figure 7:
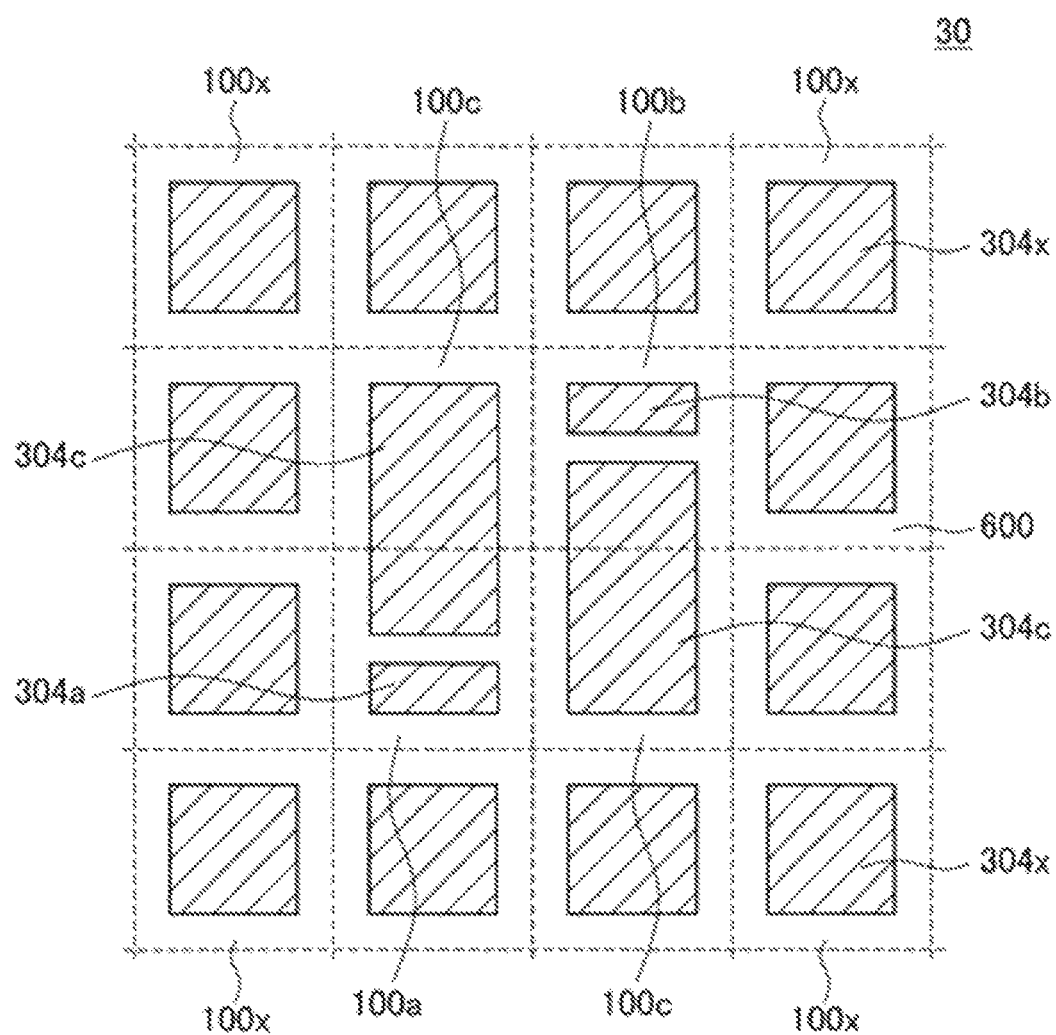
FIG. 7 is a view illustrating a planar configuration example of a pixel array unit according to a second modification of the embodiment.

In the first embodiment and the first modification described above, the lower electrode 304a of the phase difference detection pixel 100a and the lower electrode 304c of the adjacent pixel 100c are arranged side by side in the horizontal direction (left-right direction in the drawing). However, the arrangement in the embodiment of the present disclosure is not limited to such an arrangement. For example, the lower electrode 304a and the lower electrode 304c may be arranged side by side in the vertical direction (up-down direction in the drawing). Specifically, as illustrated in FIG. 7, each of the lower electrodes 304a and 304b of the phase difference detection pixels 100a and 100b and the lower electrode 304c of the adjacent pixel 100c are arranged side by side in the vertical direction (up-down direction in the drawing). In FIG. 5, the pair of phase difference detection pixels 100a and 100b has the lower electrodes 304a and 304b respectively at positions that are up-down symmetric with respect to each other, leading to high sensitivity to phase difference detection in the vertical direction.

Third Modification

Figure 8:
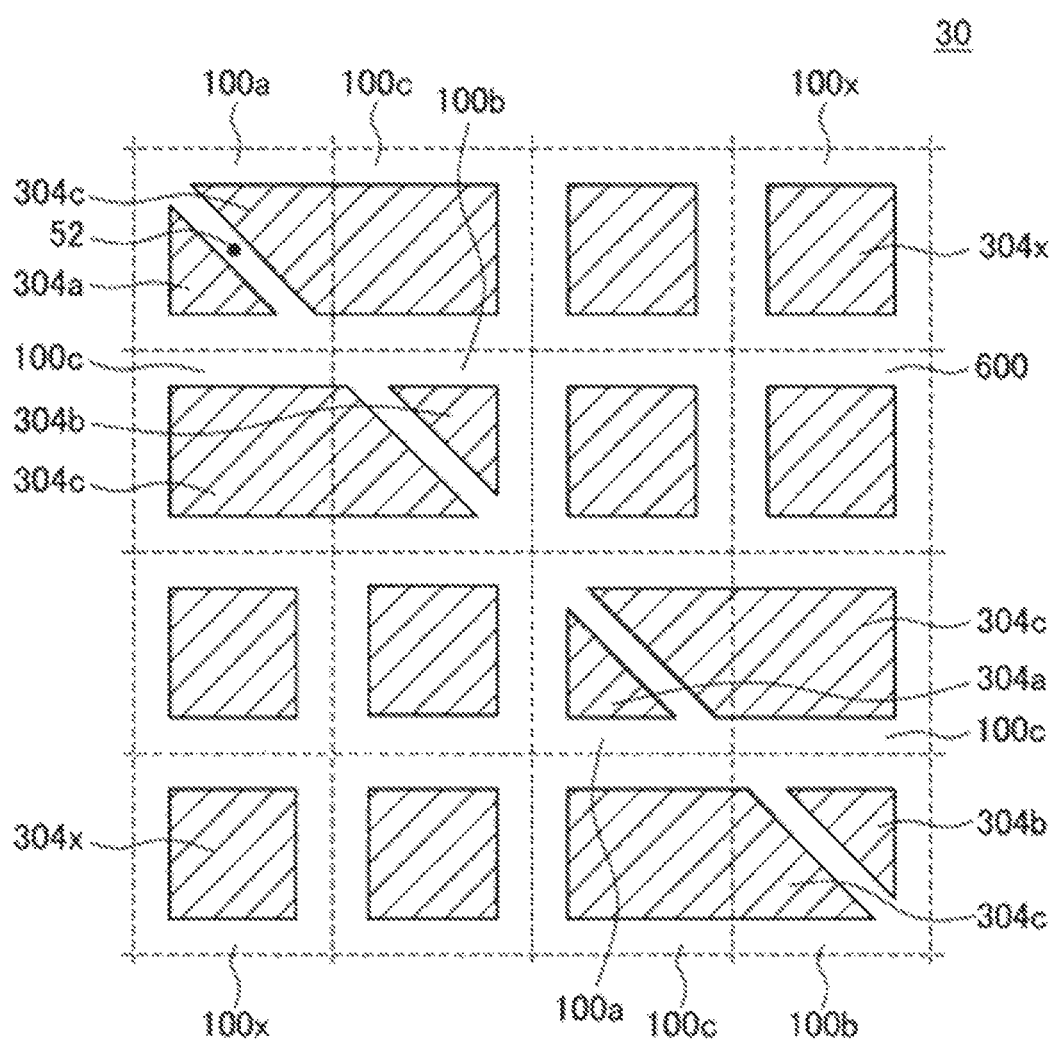
FIG. 8 is a view illustrating a planar configuration example of a pixel array unit according to a third modification of the embodiment.

In the description of the first embodiment and its first and second modifications described above, each of the lower electrodes 304a, 304b, and 304c has a rectangular shape. However, the shape is not limited to such a shape in the embodiment of the present disclosure. For example, the lower electrodes 304a and 304b of the phase difference detection pixels 100a and 100b may be provided in a triangular shape when viewed from above the semiconductor substrate 10. The lower electrode 304c of the adjacent pixel 100c may be provided in a trapezoidal shape when viewed from above the semiconductor substrate 10. Specifically, as illustrated in FIG. 8, the phase difference detection pixels 100a and 100b may have the lower electrodes 304a and 304b respectively having a triangular shape, such as a shape obtained by dividing the lower electrode 304x along a diagonal line of the section 600 including these pixels. While the lower electrodes 304a and 304b illustrated in FIG. 8 have the shape of an isosceles right triangle, the shape in the embodiment of the present disclosure is not limited to such a triangle, and may be other triangles. In the adjacent pixel 100c adjacent to the phase difference detection pixels 100a and 100b, the lower electrode 304c is formed so as to cover the section 600 of the phase difference detection pixels 100a and 100b, and having a trapezoidal shape as a whole. Specifically, in the section 600 of the phase difference detection pixels 100a and 100b, the lower electrodes 304a and 304b and the lower electrode 304c are symmetric about the optical axis 52 of the on-chip lens 502 provided in the section 600.

That is, in the embodiment of the present disclosure, the lower electrodes 304a and 304b and the lower electrode 304c are preferably provided in the section 600 including the phase difference detection pixels 100a and 100b so as to be symmetric about the optical axis 52 of the on-chip lens 502 provided in the section 600. In other words, the lower electrodes 304a and 304b and the lower electrode 304c are preferably provided so as to be symmetric with each other with respect to the incident direction of light incident on the section 600, in the section 600 including the phase difference detection pixels 100a and 100b. In this manner, with the configuration in which the lower electrodes 304a and 304b are provided corresponding to the incident direction of light, it is possible to collect the incident light more efficiently and improve the detection sensitivity in detecting the phase difference. For example, in the section 600 where light is incident diagonally, it is preferable to provide the lower electrodes 304a and 304b as triangular lower electrodes provided along lines that divide the section 600 diagonally as illustrated in FIG. 8.

Fourth Modification

Figure 9:
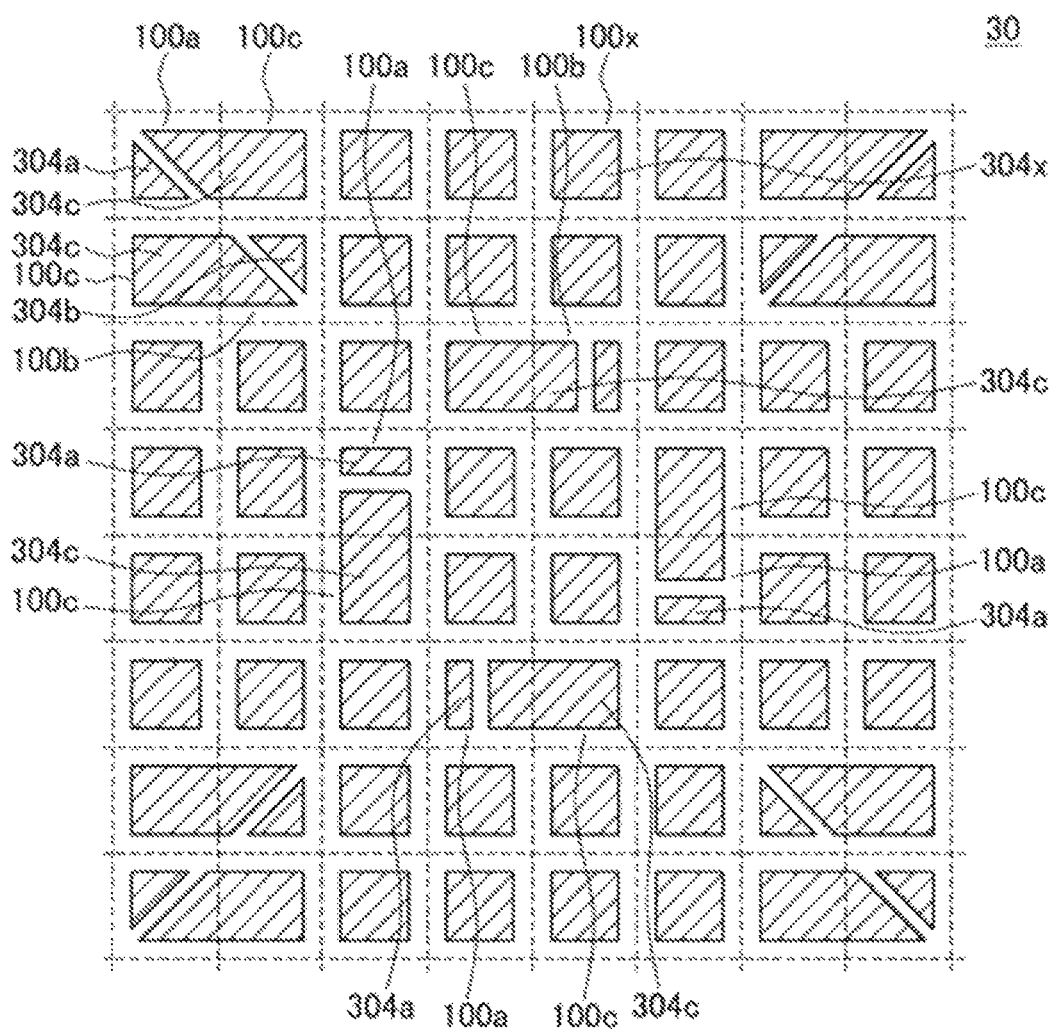
FIG. 9 is a view illustrating a planar configuration example of a pixel array unit according to a fourth modification of the embodiment.

In the embodiment of the present disclosure, the lower electrodes 304a, 304b, and 304c having the forms illustrated as the first embodiment and the second and third modifications may be provided mixed with each other in one pixel array unit 30. Specifically, as illustrated in FIG. 9, in the peripheral region of the pixel array unit 30, in other words, at the four corners of the pixel array unit 30, there are provided the phase difference detection pixels 100a and 100b and the adjacent pixels 100c having the triangular and trapezoidal lower electrodes 304a, 304b, and 304c according to the above-described third modification. In addition, the central region of the pixel array unit includes the phase difference detection pixels 100a and 100b and the adjacent pixels 100c having the rectangular lower electrodes 304a, 304b, and 304c according to the first embodiment and the second modification described above. Incident directions of light incident on the section 600 including each of pixels 100 are different corresponding to the positions in the pixel array unit 30. Accordingly, in the peripheral region of the pixel array unit 30 where light is incident diagonally, the lower electrodes 304a, 304b, and 304c are provided in triangular shapes so as to be symmetric with each other with respect to the incident direction in the section 600 of the phase difference detection pixels 100a and 100b. In contrast, in the central region of the pixel array unit 30 where light is incident perpendicularly, the lower electrodes 304a, 304b, are 304c are provided in rectangular shapes so as to be symmetric with each other with respect to the incident direction in the section 600 of the phase difference detection pixels 100a and 100b. In this manner, the shapes of the lower electrodes 304a, 304b, and 304c vary, in the present modification, in accordance with the incident direction. This makes it possible to collect incident light further efficiently, leading to improvement of phase difference detection accuracy.

Fifth Modification

In the first embodiment and the first to fourth modifications described so far, the area of the lower electrode 304c of the adjacent pixel 100c is increased, leading to achievement of higher sensitivity to light in the PD 200 of the adjacent pixel 100c, than that of the normal pixel 100x. That is, since the light conversion efficiency of the adjacent pixel 100c is higher than that of the normal pixel 100x, the adjacent pixel 100c is required to generate a signal for image generation by performing correction processing on the portion obtained by the higher conversion efficiency. In the present modification, in order to avoid such correction processing, a capacitance (capacitor) (not illustrated) is provided between each of the lower electrode 304a, 304b, and 304c and the charge storage unit 24, and the capacitance is provided so as to set the capacitance connected to the lower electrode 304c of the adjacent pixel 100c greater than the capacitance connected to the lower electrode 304c of the normal pixel 100x. With this configuration, the charge (output signal) stored in the charge storage unit 24 can be corrected due to the difference in the magnitude of the connected capacitance, making it possible to adjust the adjacent pixel 100c to be a pixel equivalent to the normal pixel 100x. That is, the apparent conversion efficiency of the adjacent pixel 100c can be reduced to the level equivalent to the level of the normal pixel 100x. Therefore, according to the present modification, it is possible, in the adjacent pixel 100c, to generate a signal for image generation without performing the above-described correction processing when generating a signal.

5. SECOND EMBODIMENT

Figure 10:
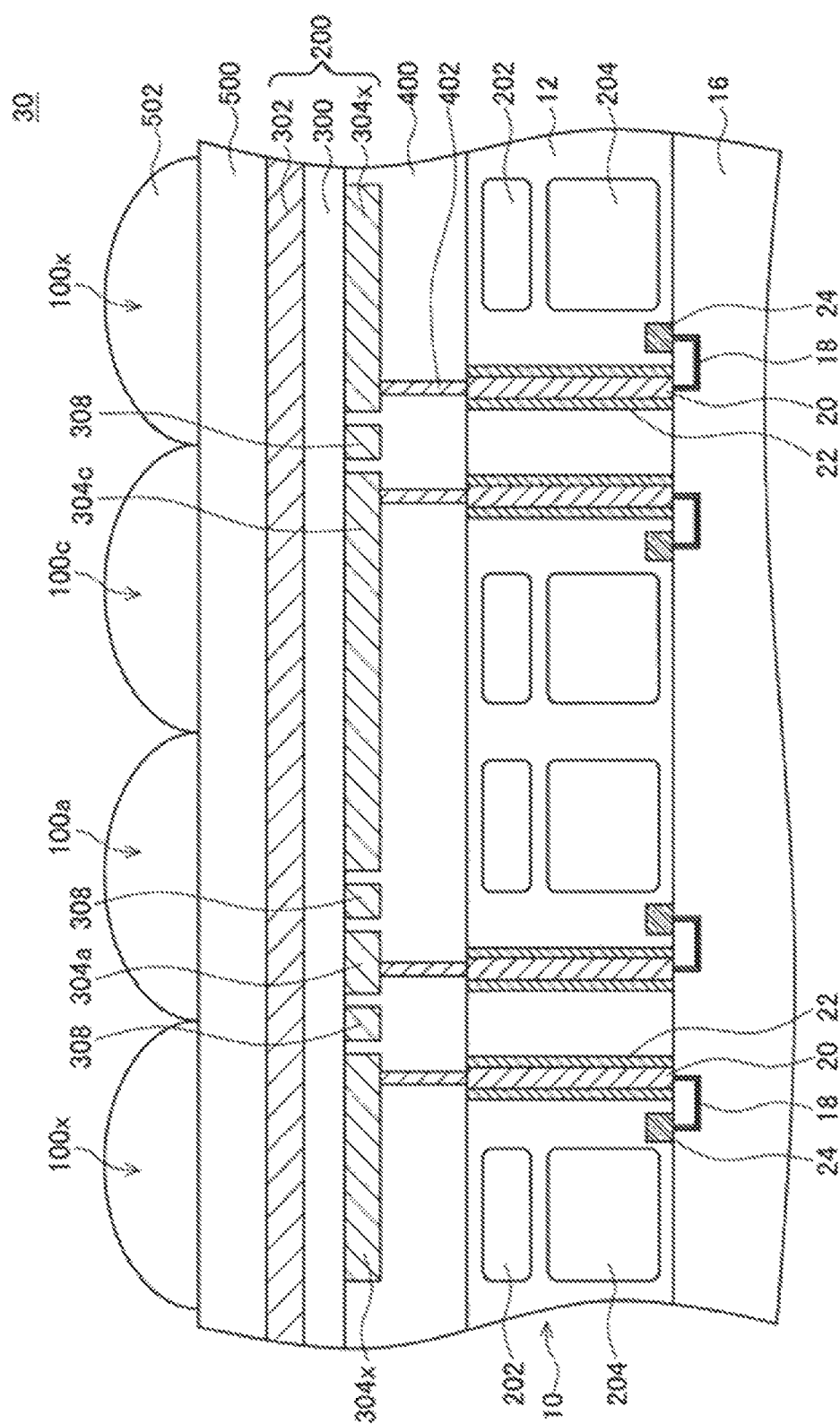
FIG. 10 is a view illustrating a cross-sectional configuration example of a phase difference detection pixel and adjacent pixels according to a second embodiment of the present disclosure.
Figure 11:
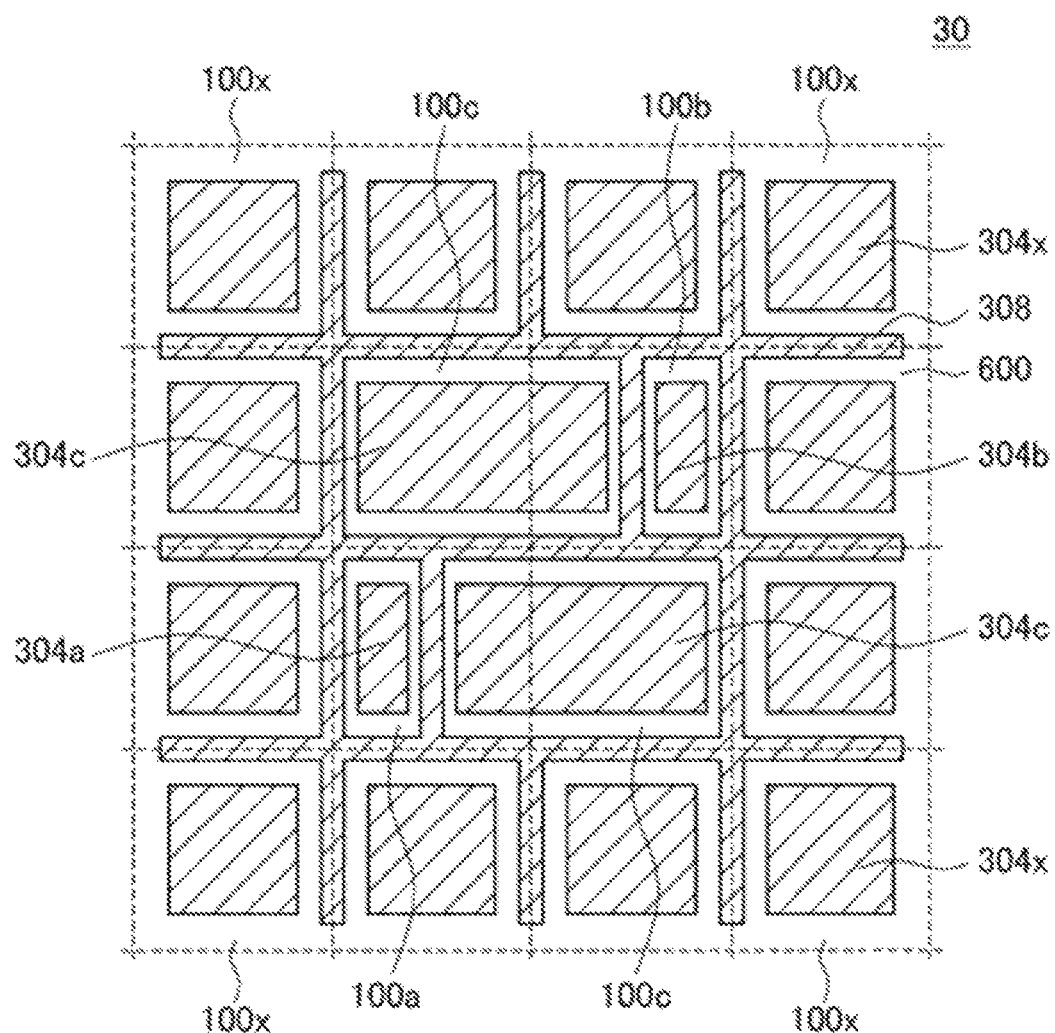
FIG. 11 is a view illustrating a planar configuration example of the pixel array unit according to the embodiment.

In the embodiment of the present disclosure, it is allowable to provide an additional electrode 308 between the lower electrodes 304a and 304b of the phase difference detection pixels 100a and 100b and the lower electrode 304c of the adjacent pixel 100c in order to improve the phase difference detection accuracy. Hereinafter, a second embodiment in which such an additional electrode 308 is provided will be described with reference to FIGS. 10 and 11. FIG. 10 is a view illustrating a cross-sectional configuration example of the phase difference detection pixel and the adjacent pixels according to the present embodiment. Specifically, the cross section corresponds to a cross section obtained by cutting the pixels arranged in the pixel array unit 30, namely, the normal pixels 100x, the phase difference detection pixels 100a, the adjacent pixel 100c, and the normal pixels 100x arranged in this order, in the thickness direction of the semiconductor substrate 10. FIG. 11 is a view illustrating a planar configuration example of the pixel array unit 30 according to the present embodiment.

As illustrated in FIGS. 10 and 11, in the present embodiment, the additional electrode 308 having a predetermined pattern width is provided between the lower electrodes 304a and 304b of the phase difference detection pixels 100a and 100b and the lower electrode 304c of the adjacent pixel 100c. Furthermore, in the present embodiment, the additional electrode 308 is similarly provided between the lower electrodes 304a and 304b of the phase difference detection pixels 100a and 100b and the lower electrode 304x of the normal pixel 100x, and between the lower electrode 304c of the adjacent pixel 100c and the lower electrode 304x of the normal pixel 100x. The additional electrode 308 is electrically connected to wiring (not illustrated) provided around the pixel array unit 30, and is further electrically connected to a voltage application part (not illustrated) via the wiring, making it possible to supply a predetermined voltage to the additional electrode 308. That is, the potential of the additional electrode 308 in the present embodiment can be fixed to a predetermined potential. As a result, the additional electrode 308 can block capacitive coupling between the charge storage unit 24 electrically connected to the lower electrodes 304a and 304b and the charge storage unit 24 electrically connected to the lower electrode 304c. Therefore, according to the present embodiment, the potential of the charge storage unit 24 of the phase difference detection pixels 100a and 100b and the potential of the charge storage unit 24 of the adjacent pixel 100c are not affected by each other, and can be maintained depending on the generated charges, making it possible to further improve the phase difference detection accuracy.

In the present embodiment, the additional electrode 308 is preferably provided on the same plane as the lower electrodes 304a, 304b, and 304c. With this configuration, it is possible to improve the function of blocking the above-described capacitive coupling by additional electrode 308. Furthermore, since the additional electrode 308 is provided on the same plane as the lower electrodes 304a, 304b, and 304c, it is possible to provide the photoelectric conversion film 300 on a flat surface. This makes it possible to easily form higher-quality photoelectric conversion film 300. As a result, the photoelectric conversion characteristics of the photoelectric conversion film 300 can be further improved. In contrast, in a case where the additional electrode 308 is not provided on the same plane as the lower electrode 304a, 304b, or 304c, the degree of freedom in layout is increased while the function of blocking capacitive coupling is weakened. This makes it possible to achieve further miniaturization of the solid-state imaging device 1.

6. THIRD EMBODIMENT

6.1 Detailed Configuration of Solid-State Imaging Device

Figure 12:
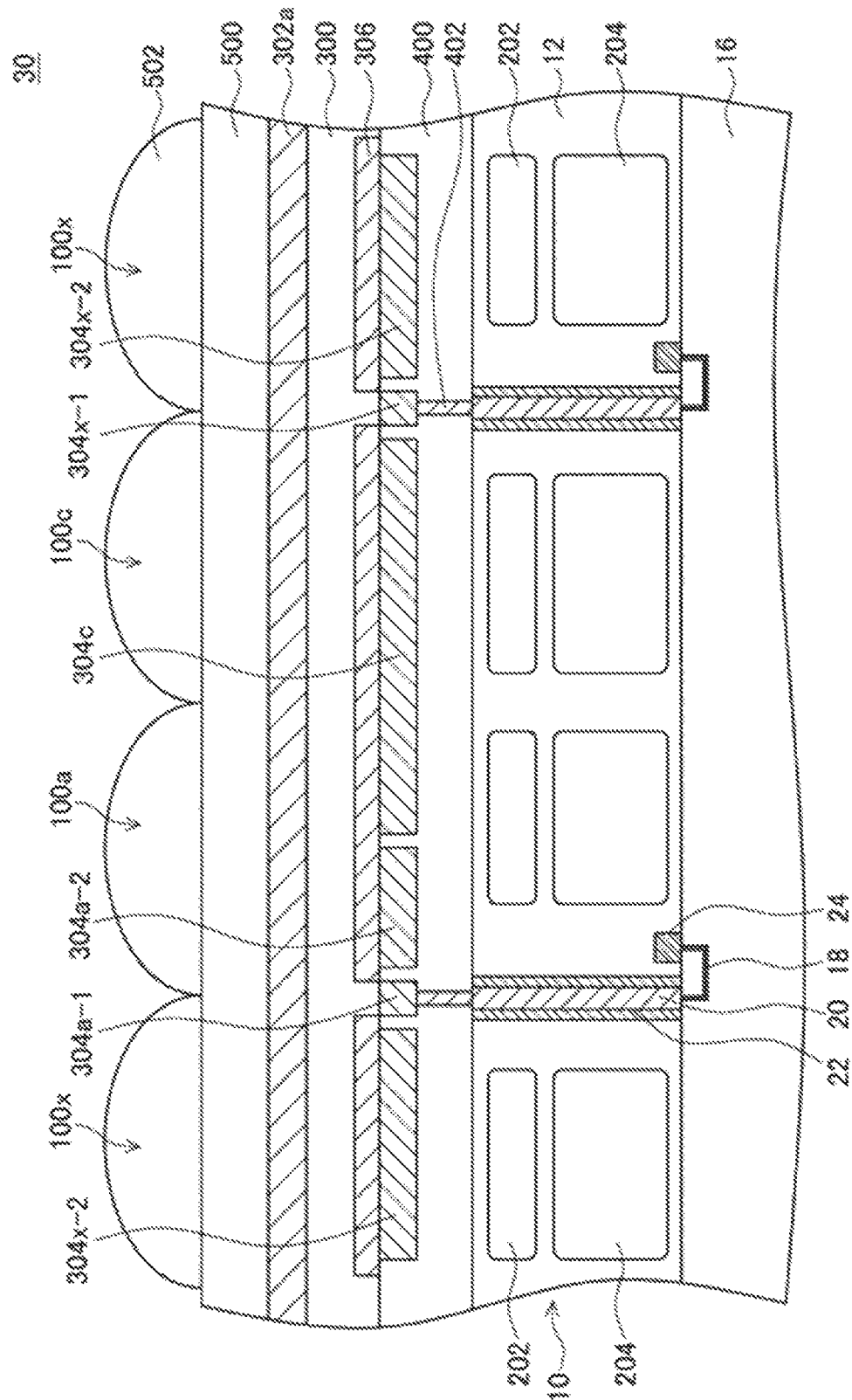
FIG. 12 is a view illustrating a cross-sectional configuration example of a phase difference detection pixel and adjacent pixels according to a third embodiment of the present disclosure.

Furthermore, the solid-state imaging device 1 according to the embodiment of the present disclosure is not limited to a form in which the charge photoelectrically converted by the photoelectric conversion film 300 is temporarily held in the charge storage unit 24, and may have a form in which the charge is temporarily held in the photoelectric conversion film 300. Hereinafter, a third embodiment of the present disclosure as described above will be described with reference to FIG. 12. FIG. 12 is a view illustrating a cross-sectional configuration example of the phase difference detection pixels 100a and 100b according to the present embodiment. Specifically, the cross section corresponds to a cross section obtained by cutting the pixels arranged in the pixel array unit 30, namely, the phase difference detection pixels 100a, the normal pixel 100x, and the phase difference detection pixels 100b arranged in this order, in the thickness direction of the semiconductor substrate 10.

As illustrated in FIG. 12, in the present embodiment, the lower electrode 304x of the normal pixel 100x and the lower electrodes 304a and 304b of the phase difference detection pixels 100a and 100b are each divided into two. Specifically, the lower electrode 304x of the normal pixel 100x is divided into a lower electrode 304x-1 and a lower electrode 304x-2. The lower electrodes 304a and 304b of the phase difference detection pixels 100a and 100b are also divided into a lower electrode 304a-1 (304b-1) and a lower electrode 304a-2 (304b-2). Furthermore, the lower electrodes 304x-2 and 304a-2 face the photoelectric conversion film 300 across the insulating film 306.

Furthermore, in the normal pixel 100x, wiring (not illustrated) is connected to the lower electrode 304x-2, and a desired potential is applied to the lower electrode 304x-2 using the wiring. Wiring (not illustrated) is also connected to the lower electrode 304x-1, and a desired potential is applied to the lower electrode 304x-1 using the wiring. Furthermore, the lower electrode 304x-1 is connected to the charge storage unit 24 provided on the semiconductor substrate 10 by the plug 20 or the like. In the present embodiment, controlling the potential applied to the lower electrode 304x-1 and the lower electrode 304x-2 makes it possible to store the charge generated in the photoelectric conversion film 300 in the photoelectric conversion film 300 or possible to extract the charge to the charge storage unit 24. In other words, the lower electrode 304x-2 can function as a charge storage electrode for attracting the charge generated in the photoelectric conversion film 300 in accordance with the applied potential and storing the charges in the photoelectric conversion film 300.

Furthermore, the lower electrodes 304a-1 and 304a-2 of the phase difference detection pixels 100a and 100b and the lower electrode 304c of the adjacent pixel 100c are connected to wiring (not illustrated) similarly to the lower electrode 304x-2 described above, and thus, a desired potential is applied to these electrodes using the wiring. Accordingly, the lower electrode 304a-2 of the phase difference detection pixels 100a and 100b and the lower electrode 304c of the adjacent pixel 100c can also function as a charge storage electrode for storing the charge in the photoelectric conversion film 300 similarly to the lower electrode 304x-2 described above.

In this manner, it is possible to store or extract the charges in or from the photoelectric conversion film 300 in accordance with the potential applied to the lower electrode 304. This makes it possible, in the present embodiment, to provide the charge storage unit 24 to be shared by a plurality of pixels, rather than providing the charge storage unit 24 for each of pixels. Therefore, in the present embodiment, it is possible to suppress the increase in the number of charge storage units 24 and plugs 20 connected to the charge storage units 24, making it possible to achieve further miniaturization of the solid-state imaging device 1.

6.2 Modification

Figure 13:
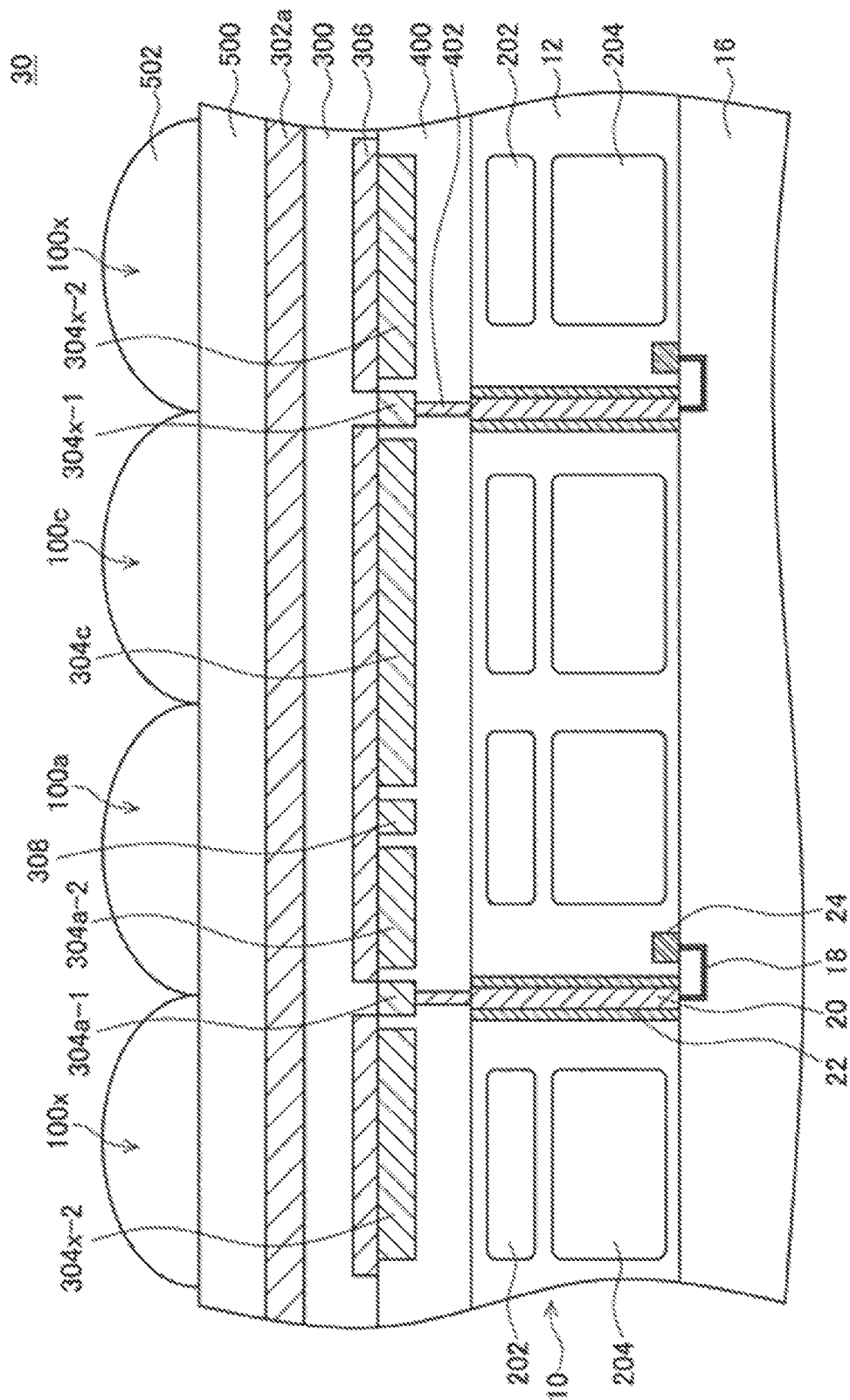
FIG. 13 is a view illustrating a cross-sectional configuration example of a phase difference detection pixel and adjacent pixels according to a modification of the embodiment.

Note that the additional electrode 308 of the second embodiment described above may be applied to the present embodiment illustrated in FIG. 12. Hereinafter, such a modification will be described with reference to FIG. 13. FIG. 13 is a view illustrating a cross-sectional configuration example of the phase difference detection pixel and the adjacent pixels according to the present modification. Specifically, the cross section corresponds to a cross section obtained by cutting the pixels arranged in the pixel array unit 30, namely, the normal pixels 100x, the phase difference detection pixels 100a, the adjacent pixel 100c, and the normal pixels 100x arranged in this order, in the thickness direction of the semiconductor substrate 10.

As illustrated in FIG. 13, in comparison with the third embodiment illustrated in FIG. 12, the present modification includes the additional electrode 308 between the lower electrodes 304a and 304b of the phase difference detection pixels 100a and 100b and the lower electrode 304c of the adjacent pixel 100c. In the present modification, similarly to the second embodiment, the potential of the additional electrode 308 is also fixed to a predetermined potential. Therefore, the additional electrode 308 can block capacitive coupling between the lower electrode 304a-2 of the phase difference detection pixel 100a and the lower electrode 304c of the adjacent pixel 100c. As a result, in the present modification, the potential of the lower electrode 304a-2 of the phase difference detection pixel 100a and the potential of the lower electrode 304c of the adjacent pixel 100c are maintained at a desired potential without being affected by each other, making it possible to further improve the accuracy in phase difference detection.

7. FOURTH EMBODIMENT

Figure 14:
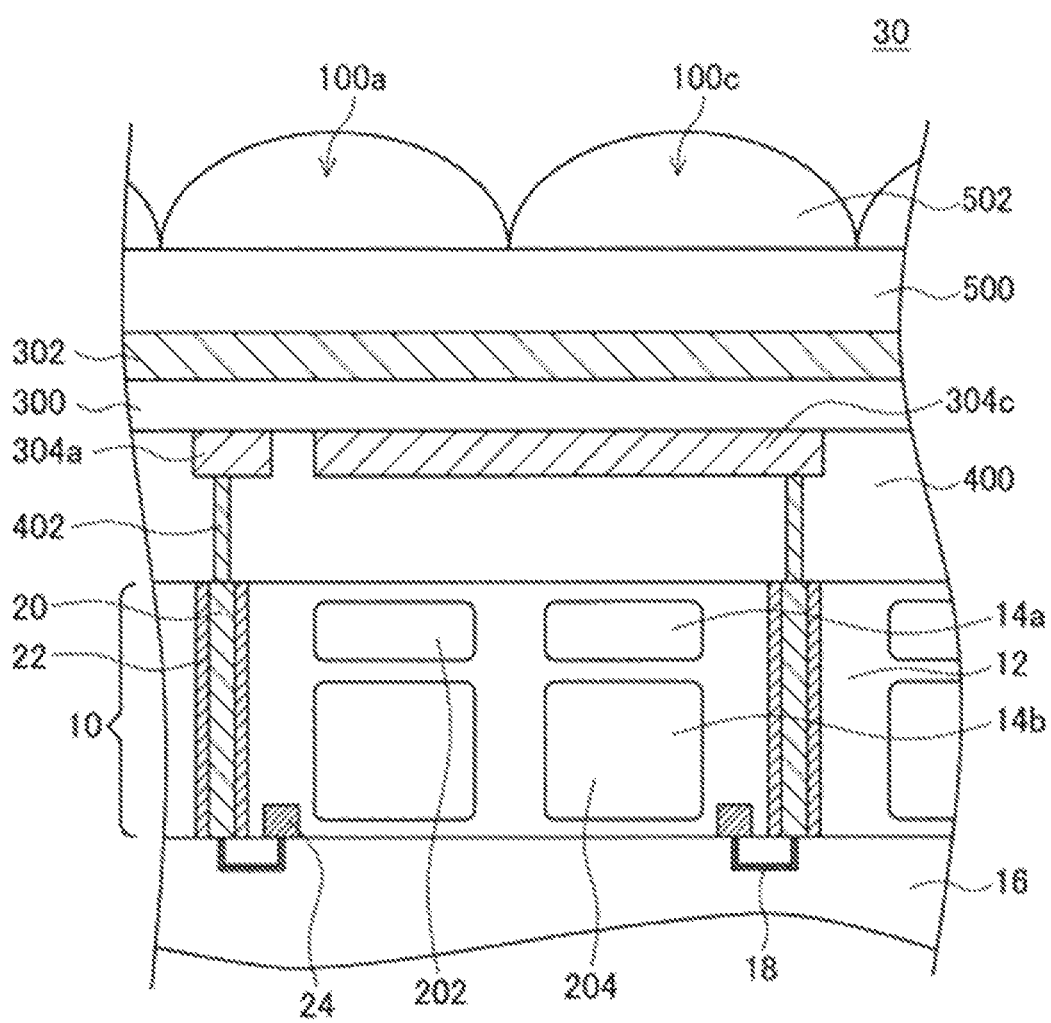
FIG. 14 is a view (part 1) illustrating a fourth embodiment of the present disclosure.
Figure 15:
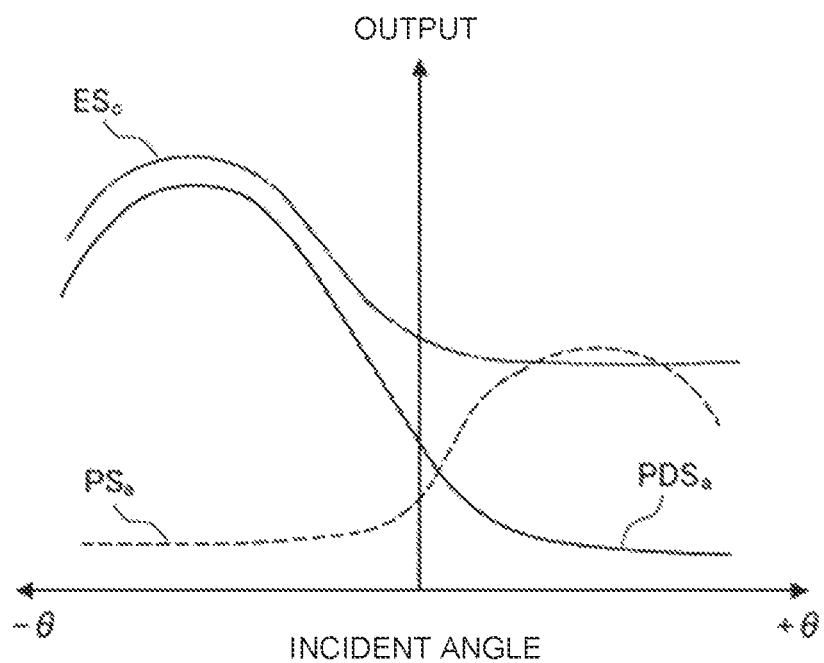
FIG. 15 is a graph (part 2) illustrating the embodiment.
Figure 16:
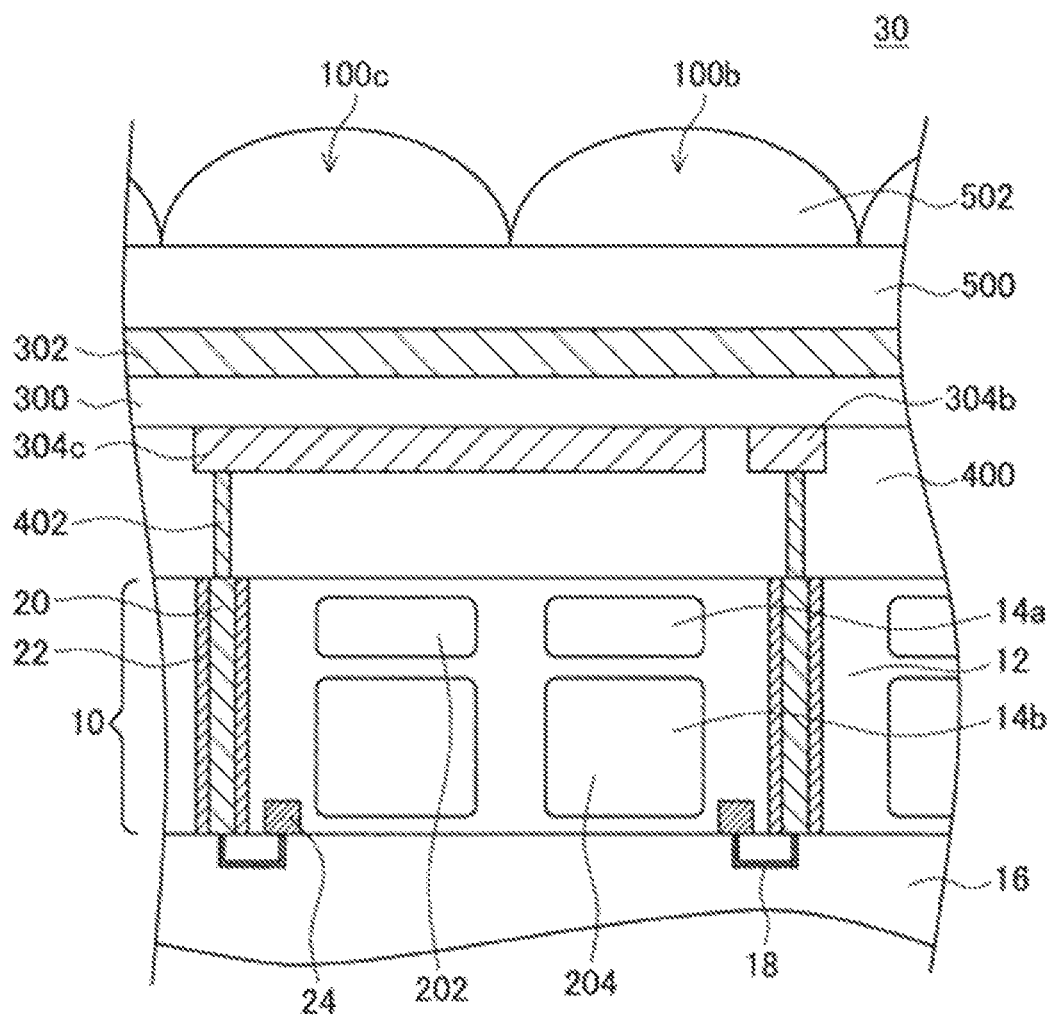
FIG. 16 is a view (part 3) illustrating the embodiment.
Figure 17:
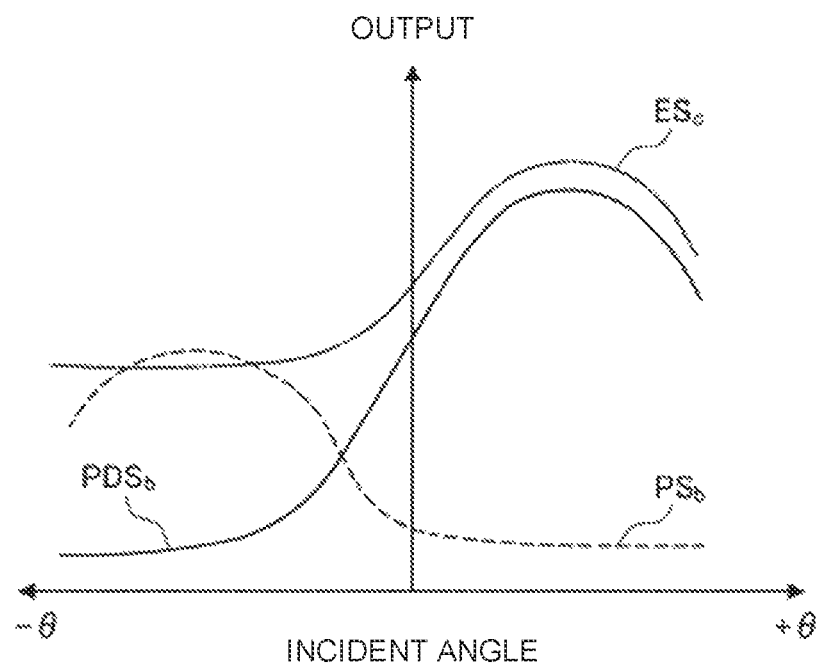
FIG. 17 is a graph (part 4) illustrating the embodiment.

In the first embodiment described above, the phase difference detection is performed by detecting the signal output difference or output ratio of the pair of phase difference detection pixels 100a and 100b. However, the embodiment of the present disclosure is not limited to the phase difference detection method as described above, and the phase difference may be detected using another method. Accordingly, a method for detecting a phase difference using the adjacent pixel 100c will be described below with reference to FIGS. 14 to 17 as a fourth embodiment of the present disclosure. FIGS. 14 to 17 are views illustrating the fourth embodiment of the present disclosure. Specifically, FIGS. 14 and 16 are views illustrating cross-sectional configuration examples of the phase difference detection pixel 100a and the adjacent pixel 100c according to the first embodiment. Specifically, the cross sections correspond to cross sections obtained by cutting the pixels arranged in the pixel array unit 30, namely, the phase difference detection pixels 100a (100b) and the adjacent pixel 100c arranged in this order, in the thickness direction of the semiconductor substrate 10. Furthermore, FIG. 15 is a graph illustrating signal outputs (sensitivities) of the PD 200 of the phase difference detection pixel 100a and the PD 200 of the adjacent pixel 100c illustrated in FIG. 14. Furthermore, FIG. 17 is a graph illustrating signal outputs (sensitivities) of the PD 200 of the phase difference detection pixel 100b and the PD 200 of the adjacent pixel 100c illustrated in FIG. 16.

First, FIG. 14 illustrates a stacked structure of the phase difference detection pixel (first phase difference detection pixel) 100a and the adjacent pixel 100c according to the first embodiment described above. Here, detailed description of the stacked structure will be omitted. As observed from FIG. 14, the PD 200 of the phase difference detection pixel 100a has the lower electrode 304a that covers the left half of the section 600 of the phase difference detection pixel 100a. As described above, the PD 200 of the phase difference detection pixel 100a has asymmetry with respect to the incident angle of light indicated as the output signal PSa in FIG. 15. In contrast, the adjacent pixel 100c adjacent to the phase difference detection pixel 100a in FIG. 14 generates a charge by light incident on the section 600 of the adjacent pixel 100c and the right half of the section 600 of the phase difference detection pixel 100a, and thus, has asymmetry with respect to the incident angle of light illustrated as an output signal ESc in FIG. 15. In other words, the output signal ESc of the adjacent pixel 100c generates a larger amount of charge than the phase difference detection pixel 100a, and thus, has a greater maximum output, and furthermore, has its peak at a position symmetric to the peak of PSa of the phase difference detection pixel 100a with respect to the Y axis (optical axis 52) at which the incident angle is 0 degrees. Therefore, the output signal PSa of the phase difference detection pixel 100a and the output signal ESc of the adjacent pixel 100c adjacent to the phase difference detection pixel 100a have outputs of different tendencies with respect to the incident angle of light, making it possible to obtain a difference between these signals. The difference between these signals is represented as a difference signal (first output difference) PDSa in FIG. 15. As observed from FIG. 15, the difference signal PDSa has a tendency to change more steeply with respect to the incident angle, than the output signal PSa of the phase difference detection pixel 100a.

Similarly, FIG. 16 illustrates a stacked structure of the phase difference detection pixel (second phase difference detection pixel) 100b and the adjacent pixel 100c according to the first embodiment described above. As observed from FIG. 16, the PD 200 of the phase difference detection pixel 100b has the lower electrode 304b that covers the right half of the section 600 of the phase difference detection pixel 100b. As described above, the PD of the phase difference detection pixel 100b has asymmetry with respect to the incident angle of light indicated as the output signal PSb in FIG. 17. In contrast, the adjacent pixel 100c adjacent to the phase difference detection pixel 100b in FIG. 16 generates a charge by light incident on the section 600 of the adjacent pixel 100c and the left half of the section 600 of the phase difference detection pixel 100b, and thus, has asymmetry with respect to the incident angle of light illustrated as an output signal ESc in FIG. 17. The difference between the two is represented as a difference signal (second output difference) PDSb in FIG. 17. Similarly to the above, the difference signal PDSb that is a difference between the output signal PSb of the PD 200 of the phase difference detection pixel 100b and the output signal ESc of the PD 200 of the adjacent pixel 100c adjacent to the phase difference detection pixel 100b has a tendency to change more steeply with respect to the incident angle, than the output signal PSb of the phase difference detection pixel 100b.

In the present embodiment, the phase difference can be detected by comparing the difference signal PDSa and the difference signal PDSb described above and obtaining the difference between these. That is, in the present embodiment, the phase difference is detected using the difference signal PDSa and the difference signal PDSb instead of the output signals PSa and PSb used in detecting the phase difference in the first embodiment. Additionally, as described above, the difference signal PDSa and the difference signal PDSb tend to change more steeply than the incident angle, that is, the sensitivity is high with respect to the incident angle. Therefore, according to the present embodiment, it is possible to further improve the phase difference detection accuracy by using such difference signals PDSa and PDSb. In the present embodiment, such difference signals PDSa and PDSb, and the difference between these signals, can be detected by a detection unit (not illustrated) of the output circuit unit 38, for example.

While the above has described a case where the difference between the difference signal PDSa and the difference signal PDSb is detected as a phase difference, the present embodiment is not limited to this. For example, the phase difference may be detected by comparing the difference signal PDSa and the difference signal PDSb and obtaining a ratio of these.

8. FIFTH EMBODIMENT

Figure 18:
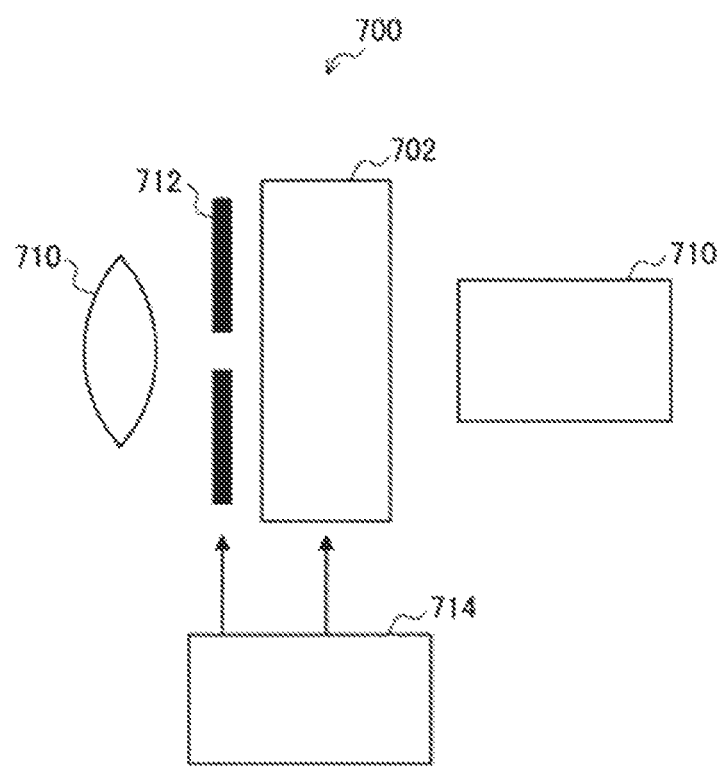
FIG. 18 is a diagram illustrating an example of an electronic apparatus including an imaging apparatus having a solid-state imaging device according to an embodiment of the present disclosure.

The solid-state imaging device 1 according to the above-described embodiment of the present disclosure is generally applicable to electronic apparatuses using a solid-state imaging device as an image capturing part, such as an imaging apparatus including a digital still camera and a video camera, a mobile terminal device having an imaging function, a copying machine using a solid-state imaging device for an image reading part. Furthermore, the embodiment of the present disclosure is applicable to a robot, a drone, an automobile, a medical device (endoscope), or the like including the above-described imaging apparatus. Note that the solid-state imaging device 1 according to the present embodiment may be formed as a single chip, and can be implemented in the form of a module having an imaging function in which an imaging unit and a signal processing unit or an optical system are packaged together. Hereinafter, an example of an electronic apparatus 700 equipped with an imaging apparatus 702 including the solid-state imaging device 1 according to the present embodiment will be described as a sixth embodiment with reference to FIG. 18. FIG. 18 is a diagram illustrating an example of the electronic apparatus 700 equipped with the imaging apparatus 702 including the solid-state imaging device 1 according to an embodiment of the present disclosure.

As illustrated in FIG. 18, the electronic apparatus 700 includes an imaging apparatus 702, an optical lens 710, a shutter mechanism 712, a drive circuit unit 714, and a signal processing circuit unit 716. The optical lens 710 focuses image light (incident light) from the subject onto an imaging surface of the imaging apparatus 702. This allows signal charges to be stored in the solid-state imaging device 1 of the imaging apparatus 702 for a certain period. The shutter mechanism 712 performs opening/closing operation to control the light emission period and the light shielding period to the imaging apparatus 702. The drive circuit unit 714 supplies drive signals for controlling signal transfer operation of the imaging apparatus 702, shutter operation of the shutter mechanism 712, or the like. That is, the imaging apparatus 702 performs signal transfer on the basis of the drive signal (timing signal) supplied from the drive circuit unit 714. The signal processing circuit unit 716 performs various types of signal processing. For example, the signal processing circuit unit 716 outputs a video signal subjected to signal processing to a storage medium (not illustrated) such as a memory device, or outputs the signal to a display unit (not illustrated).

9. SUMMARY

As described above, according to the embodiment of the present disclosure, it is possible to improve the light detection sensitivity while enabling the miniaturization of pixels.

While the embodiment of the present disclosure described above is an exemplary case of the solid-state imaging device in which the first conductivity type is the P-type, the second conductivity type is the N-type, and electrons are used as the signal charges, the embodiment of the present disclosure is not limited to such an example. For example, the present embodiment is applicable to a solid-state imaging device in which the first conductivity type is N-type, the second conductivity type is P-type, and holes are used as signal charges.

In the embodiment of the present disclosure described above, the semiconductor substrate 10 need not be a silicon substrate, and may be another substrate (for example, a Silicon On Insulator (SOI) substrate or a SiGe substrate). Furthermore, the semiconductor substrate 10 may include a semiconductor structure or the like formed on such various substrates.

Furthermore, the solid-state imaging device according to the embodiment of the present disclosure is not limited to the solid-state imaging device that detects the distribution of the incident light amount of visible light and forms an image. For example, the present embodiment is applicable to a solid-state imaging device that forms an image from an incident amount distribution such as infrared rays, X-rays, or particles, or other type of solid-state imaging device (physical quantity distribution detection apparatus) that detects distribution of other physical quantity such as pressure and capacitance and forms an image, such as a fingerprint detection sensor.

10. SUPPLEMENT

The preferred embodiments of the present disclosure have been described in detail above with reference to the accompanying drawings. However, the technical scope of the present disclosure is not limited to such examples. It is obvious that a person having ordinary knowledge in the technological field of the present disclosure can conceive alterations or modifications within the scope of the technical concept described here in the claims, and these, of course, should understandably belong to the technical scope of the present disclosure.

Furthermore, the effects described in the present specification are merely illustrative or exemplary and are not limited. That is, the technology according to the present disclosure can exhibit other effects that are apparent to those skilled in the art from the description of the present specification in addition to or instead of the above effects.

The following configurations also belong to the technological scope of the present disclosure.

(1)

A solid-state imaging device comprising:
a substrate having a pixel array unit sectioned into a matrix;
a plurality of normal pixels, a plurality of phase difference detection pixels, and a plurality of adjacent pixels adjacent to the phase difference detection pixels, each provided in each of the plurality of sections; wherein each of the normal pixel, the phase difference detection pixel, and the adjacent pixel has a photoelectric conversion film, and an upper electrode and a lower electrode that sandwich the photoelectric conversion film in a thickness direction of the photoelectric conversion film, the lower electrode, in the normal pixel, is provided separately for each of sections in which the normal pixel is provided, and the lower electrode, in the adjacent pixel, extends from the section in which the adjacent pixel is provided to the section in which the phase difference detection pixel adjacent to the adjacent pixel is provided, when viewed from above the substrate.

(2)
The solid-state imaging device according to (1), further comprising a lens unit provided above each of the sections.

(3)
The solid-state imaging device according to (2), wherein the lower electrode of the adjacent pixel is provided to extend from the section in which the adjacent pixel is provided to cover beyond an optical axis of the lens unit of the section in which the phase difference detection pixel adjacent to the adjacent pixel is provided, when viewed from above the substrate.

(4)
The solid-state imaging device according to (2), wherein the lower electrode of the phase difference detection pixel and the lower electrode of the adjacent pixel adjacent to the phase difference detection pixel are provided at positions symmetric to each other with respect to the optical axis of the lens unit of the section in which the phase difference detection pixel is provided, when viewed from above the substrate.

(5)
The solid-state imaging device according to any one of (1) to (4), wherein the lower electrode of the phase difference detection pixel has a rectangular shape or a triangular shape when viewed from above the substrate.

(6)
The solid-state imaging device according to any one of (1) to (5), wherein the lower electrode of the adjacent pixel has a rectangular shape or a trapezoidal shape when viewed from above the substrate.

(7)
The solid-state imaging device according to any one of (1) to (4), wherein
the lower electrode of the phase difference detection pixel located in a central region of the pixel array unit has a rectangular shape, and
the lower electrode of the phase difference detection pixel located in a peripheral region of the pixel array unit has a triangular shape.

(8)
The solid-state imaging device according to any one of (1) to (4), wherein the lower electrode of the phase difference detection pixel and the lower electrode of the adjacent pixel adjacent to the phase difference detection pixel are provided at positions symmetric to each other with respect to a light incident direction in which light is incident onto the section in which the phase difference detection pixel is provided, when viewed from above the substrate.

(9)
The solid-state imaging device according to any one of (1) to (8), further comprising a charge storage unit electrically connected to each of the lower electrodes via a capacitance, wherein a capacitance connected to the lower electrode of the adjacent pixel is greater than a capacitance connected to the lower electrode of the normal pixel.

(10)
The solid-state imaging device according to (1), wherein the lower electrode of the phase difference detection pixel is divided into two, and one of the lower electrodes is provided to face the photoelectric conversion film via an insulating film, and is provided as a charge storage electrode that attracts a charge generated in the photoelectric conversion film.

(11)
The solid-state imaging device according to any one of (1) to (10), further comprising an additional electrode provided between the lower electrode of the phase difference detection pixel and the lower electrode of the adjacent pixel adjacent to the phase difference detection pixel when viewed from above the substrate.

(12)
The solid-state imaging device according to (11), further comprising a voltage application part that applies a predetermined voltage to the additional electrode.

(13)
The solid-state imaging device according to (11) or (12), wherein the additional electrode is provided on a same plane as the lower electrode of the phase difference detection pixel and the lower electrode of the adjacent pixel adjacent to the phase difference detection pixel.

(14)
The solid-state imaging device according to any one of (1) to (13), further comprising a detection unit that detects a first output difference between the first phase difference detection pixel and the adjacent pixel adjacent to the first phase difference detection pixel, detects a second output difference between a second phase difference detection pixel paired with the first phase difference detection pixel and the adjacent pixel adjacent to the second phase difference detection pixel, and that compares the first output difference with the second output difference to detect a phase difference.

(15)
The solid-state imaging device according to any one of (1) to (14), wherein
each of the plurality of normal pixels, the plurality of phase difference detection pixels, and the plurality of adjacent pixels has a stacked structure including a plurality of photoelectric conversion elements that is stacked on each other and that absorbs light of mutually different wavelengths to generate charges, and
at least one of the plurality of photoelectric conversion elements includes the photoelectric conversion film, and the upper electrode and the lower electrode to sandwich the photoelectric conversion film.

(16)
The solid-state imaging device according to (15), wherein at least one of the plurality of photoelectric conversion elements includes an organic photoelectric conversion film.

(17)
An electronic apparatus including a solid-state imaging device, the solid-state imaging device comprising:
a substrate having a pixel array unit sectioned into a matrix;
a plurality of normal pixels, a plurality of phase difference detection pixels, and a plurality of adjacent pixels adjacent to the phase difference detection pixels, each provided in each of the plurality of sections; wherein
each of the normal pixel, the phase difference detection pixel, and the adjacent pixel has a photoelectric conversion film, and an upper electrode and a lower electrode that sandwich the photoelectric conversion film in a thickness direction of the photoelectric conversion film,
the lower electrode, in the normal pixel, is provided separately for each of sections in which the normal pixel is provided, and
the lower electrode, in the adjacent pixel, extends from the section in which the adjacent pixel is provided to the section in which the phase difference detection pixel adjacent to the adjacent pixel is provided, when viewed from above the substrate.

REFERENCE SIGNS LIST

1 SOLID-STATE IMAGING DEVICE
10 SEMICONDUCTOR SUBSTRATE
12, 14a, 14b SEMICONDUCTOR REGION
16 WIRING LAYER
18, 402 WIRE
20 PLUG
22, 306 INSULATING FILM
24 CHARGE STORAGE UNIT
30 PIXEL ARRAY UNIT
32 VERTICAL DRIVE CIRCUIT UNIT
34 COLUMN SIGNAL PROCESSING CIRCUIT UNIT
36 HORIZONTAL DRIVE CIRCUIT UNIT
38 OUTPUT CIRCUIT UNIT
40 CONTROL CIRCUIT UNIT
42 PIXEL DRIVE WIRE
44 VERTICAL SIGNAL LINE
46 HORIZONTAL SIGNAL LINE
48 INPUT/OUTPUT TERMINAL
50 CENTER POINT
52 OPTICAL AXIS
100, 100a, 100b, 100c, 100x PIXEL
200, 202, 204 PD
300 PHOTOELECTRIC CONVERSION FILM
302 UPPER ELECTRODE
304a, 304b, 304c, 304x LOWER ELECTRODE
308 ADDITIONAL ELECTRODE
400 TRANSPARENT INSULATING FILM
500 HIGH REFRACTIVE INDEX LAYER
502 ON-CHIP LENS
600 SECTION
700 ELECTRONIC APPARATUS
702 IMAGING APPARATUS
710 OPTICAL LENS
712 SHUTTER MECHANISM
714 DRIVE CIRCUIT UNIT
716 SIGNAL PROCESSING CIRCUIT UNIT

The invention claimed is:

1. A solid-state imaging device, comprising:
a substrate that comprises a pixel array unit sectioned into a matrix, wherein the pixel array unit comprises a plurality of sections;
a plurality of normal pixels, a plurality of phase difference detection pixels, and a plurality of adjacent pixels adjacent to the plurality of phase difference detection pixels, wherein
each of a normal pixel of the plurality of normal pixels, a phase difference detection pixel of the plurality of phase difference detection pixels, and an adjacent pixel of the plurality of adjacent pixels is in each section of the plurality of sections,
each of the normal pixel, the phase difference detection pixel, and the adjacent pixel has a photoelectric conversion film, and an upper electrode and a lower electrode that sandwich the photoelectric conversion film in a thickness direction of the photoelectric conversion film,
the lower electrode, in the normal pixel, is separate for each section of the plurality of sections in which the normal pixel is present, and
the lower electrode, in the adjacent pixel, extends from a section of the plurality of sections in which the adjacent pixel is present to a section of the plurality of sections in which the phase difference detection pixel adjacent to the adjacent pixel is present, when viewed from above the substrate; and
a charge storage unit electrically connected to each of the lower electrode of the phase difference detection pixel, the lower electrode of the adjacent pixel, and the lower electrode of the normal pixel via a capacitance, wherein a capacitance connected to the lower electrode of the adjacent pixel is greater than a capacitance connected to the lower electrode of the normal pixel.

2. The solid-state imaging device according to claim 1, further comprising a lens unit above each section of the plurality of sections.

3. The solid-state imaging device according to claim 2, wherein the lower electrode of the adjacent pixel extends from the section in which the adjacent pixel is present to cover beyond an optical axis of the lens unit of the section in which the phase difference detection pixel adjacent to the adjacent pixel is present, when viewed from above the substrate.

4. The solid-state imaging device according to claim 2, wherein the lower electrode of the phase difference detection pixel and the lower electrode of the adjacent pixel adjacent to the phase difference detection pixel are present at positions symmetric to each other with respect to an optical axis of the lens unit of the section in which the phase difference detection pixel is present, when viewed from above the substrate.

5. The solid-state imaging device according to claim 1, wherein the lower electrode of the phase difference detection pixel has one of a rectangular shape or a triangular shape when viewed from above the substrate.

6. The solid-state imaging device according to claim 1, wherein the lower electrode of the adjacent pixel has one of a rectangular shape or a trapezoidal shape when viewed from above the substrate.

7. The solid-state imaging device according to claim 1, wherein
the lower electrode of the phase difference detection pixel in a central region of the pixel array unit has a rectangular shape, and
the lower electrode of the phase difference detection pixel in a peripheral region of the pixel array unit has a triangular shape.

8. The solid-state imaging device according to claim 1, wherein the lower electrode of the phase difference detection pixel and the lower electrode of the adjacent pixel adjacent to the phase difference detection pixel are present at positions symmetric to each other with respect to a light incident direction in which light is incident onto the section in which the phase difference detection pixel is present, when viewed from above the substrate.

9. The solid-state imaging device according to claim 1, wherein
the lower electrode of the phase difference detection pixel is divided into two,
one of the lower electrode of the phase difference detection pixel, the lower electrode of the adjacent pixel, or the lower electrode of the normal pixel is present to face the photoelectric conversion film via an insulating film, and one of the lower electrode of the phase difference detection pixel, the lower electrode of the adjacent pixel, or the lower electrode of the normal pixel is present as a charge storage electrode that attracts a charge generated in the photoelectric conversion film.

10. The solid-state imaging device according to claim 1, further comprising an additional electrode present between the lower electrode of the phase difference detection pixel and the lower electrode of the adjacent pixel adjacent to the phase difference detection pixel when viewed from above the substrate.

11. The solid-state imaging device according to claim 10, further comprising a voltage application part that applies a voltage to the additional electrode.

12. The solid-state imaging device according to claim 10, wherein the additional electrode is present on a same plane as the lower electrode of the phase difference detection pixel and the lower electrode of the adjacent pixel adjacent to the phase difference detection pixel.

13. The solid-state imaging device according to claim 1, further comprising circuitry configured to:
detect a first output difference between a first phase difference detection pixel of the plurality of phase difference detection pixels and the adjacent pixel adjacent to the first phase difference detection pixel;
detect a second output difference between a second phase difference detection pixel of the plurality of phase difference detection pixels paired with the first phase difference detection pixel and the adjacent pixel adjacent to the second phase difference detection pixel; and
compare the first output difference with the second output difference to detect a phase difference.

14. The solid-state imaging device according to claim 1, wherein each of the plurality of normal pixels, the plurality of phase difference detection pixels, and the plurality of adjacent pixels has a stacked structure including a plurality of photoelectric conversion elements that is stacked, each of the plurality of photoelectric conversion elements absorb light of mutually different wavelengths to generate a plurality of charges, and at least one of the plurality of photoelectric conversion elements includes the photoelectric conversion film, and the upper electrode and the lower electrode to sandwich the photoelectric conversion film.

15. The solid-state imaging device according to claim 14, wherein at least one of the plurality of photoelectric conversion elements includes an organic photoelectric conversion film.

16. An electronic apparatus including a solid-state imaging device, the solid-state imaging device comprising:

a substrate that comprises a pixel array unit sectioned into a matrix, wherein the pixel array unit comprises a plurality of sections;

a plurality of normal pixels, a plurality of phase difference detection pixels, and a plurality of adjacent pixels adjacent to the plurality of phase difference detection pixels, wherein each of a normal pixel of the plurality of normal pixels, a phase difference detection pixel of the plurality of phase difference detection pixels, and an adjacent pixel of the plurality of adjacent pixels is in each section of the plurality of sections, each of the normal pixel, the phase difference detection pixel, and the adjacent pixel has a photoelectric conversion film, and an upper electrode and a lower electrode that sandwich the photoelectric conversion film in a thickness direction of the photoelectric conversion film, the lower electrode, in the normal pixel, is separate for each section of the plurality of sections in which the normal pixel is present, and the lower electrode, in the adjacent pixel, extends from a section of the plurality of sections in which the adjacent pixel is present to a section of the plurality of sections in which the phase difference detection pixel adjacent to the adjacent pixel is present, when viewed from above the substrate; and a charge storage unit electrically connected to each of the lower electrode of the phase difference detection pixel, the lower electrode of the adjacent pixel, and the lower electrode of the normal pixel via a capacitance, wherein a capacitance connected to the lower electrode of the adjacent pixel is greater than a capacitance connected to the lower electrode of the normal pixel.

* * * * *